(12) United States Patent
Matsuyama et al.

(10) Patent No.: US 11,697,770 B2
(45) Date of Patent: Jul. 11, 2023

(54) LIQUID CRYSTAL COMPOSITION, METHOD FOR PRODUCING HIGH-MOLECULAR WEIGHT LIQUID CRYSTAL COMPOUND, LIGHT ABSORPTION ANISOTROPIC FILM, LAMINATE, AND IMAGE DISPLAY DEVICE

(71) Applicant: FUJIFILM Corporation, Tokyo (JP)

(72) Inventors: Hiroshi Matsuyama, Kanagawa (JP); Wataru Hoshino, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 171 days.

(21) Appl. No.: 17/346,947

(22) Filed: Jun. 14, 2021

(65) Prior Publication Data

US 2021/0324272 A1 Oct. 21, 2021

Related U.S. Application Data

(63) Continuation of application No. PCT/JP2019/048062, filed on Dec. 9, 2019.

(30) Foreign Application Priority Data

Dec. 21, 2018 (JP) ................................ 2018-239442

(51) Int. Cl.
| | | |
|---|---|---|
| C09K 19/38 | (2006.01) | |
| G02F 1/1335 | (2006.01) | |
| C09K 19/20 | (2006.01) | |
| C09K 19/34 | (2006.01) | |
| C09K 19/56 | (2006.01) | |
| G02B 5/30 | (2006.01) | |
| G02F 1/13357 | (2006.01) | |
| G02F 1/13363 | (2006.01) | |
| C09K 19/04 | (2006.01) | |

(52) U.S. Cl.
CPC ...... *C09K 19/3804* (2013.01); *C09K 19/2007* (2013.01); *C09K 19/3497* (2013.01); *C09K 19/3852* (2013.01); *C09K 19/56* (2013.01); *G02B 5/3016* (2013.01); *G02F 1/13363* (2013.01); *G02F 1/133531* (2021.01); *G02F 1/133603* (2013.01); *C09K 2019/0448* (2013.01); *C09K 2019/2078* (2013.01); *G02F 2202/02* (2013.01); *G02F 2202/40* (2013.01)

(58) Field of Classification Search
CPC ............ C09K 19/3497; C09K 19/3852; C09K 2019/2078; C09K 2019/528; C09K 19/3804; C09K 19/601; G02F 2202/02; G02F 2202/043; C08F 220/30
See application file for complete search history.

(56) References Cited

U.S. PATENT DOCUMENTS

2015/0185512 A1* 7/2015 Kikuchi ............. C09K 19/3458
349/33
2019/0001619 A1 1/2019 Mizumura et al.
2019/0218460 A1 7/2019 Suzuki et al.
2019/0322937 A1 10/2019 Matsuyama et al.

FOREIGN PATENT DOCUMENTS

| CN | 108713045 A | 10/2018 | |
|---|---|---|---|
| JP | 2002-256031 A | 9/2002 | |
| JP | 2005-255805 A | 9/2005 | |
| JP | 2007-262195 A | 10/2007 | |
| JP | 2013-101328 A | 5/2013 | |
| WO | WO-2005081051 A1 * | 9/2005 | ......... G02F 1/13718 |

(Continued)

OTHER PUBLICATIONS

Office Action, issued by the Japanese Patent Office dated Apr. 19, 2022 in connection with Japanese Patent Application No. 2020-561319.
Office Action, issued by the Japanese Patent Office dated Feb. 1, 2022 in connection with Japanese Patent Application No. 2020-561319.
Office Action, issued by the State Intellectual Property Office dated Aug. 29, 2022 in connection with Chinese Patent Application No. 201980084071.5.
International Search Report issued in PCT/JP2019/048062 dated Mar. 10, 2020.

(Continued)

*Primary Examiner* — Paul C Lee
(74) *Attorney, Agent, or Firm* — Edwards Neils LLC; Jean C. Edwards, Esq.

(57) ABSTRACT

The present invention provides a liquid crystal composition with which a light absorption anisotropic film excellent in plane shape uniformity with a high alignment degree can be formed, a method of producing same, a light absorption anisotropic film, a laminate, and an image display device. The liquid crystal composition contains a high-molecular weight liquid crystal compound, and a dichroic substance, where the composition is a copolymer containing 90% by mass or more of a repeating unit (1) of Formula (1) and 10% by mass or less of a repeating unit (2) of Formula (2). In Formulae (1) and (2), P1 to P3 represent main chains, L1 to L3 represent a single bond or divalent linking group, P2 to SP3 represent a single bond or spacer group (SP1), M1 to M3 represent mesogenic groups, T1 represents a terminal group, and n and m are integers of 0 or 1.

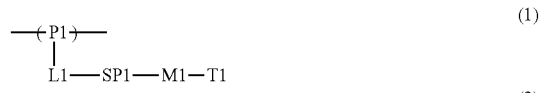

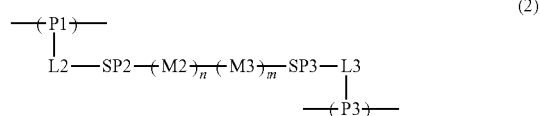

19 Claims, No Drawings

(56) References Cited

FOREIGN PATENT DOCUMENTS

WO    2018/062068 A1    4/2018
WO    2018/124198 A1    7/2018

OTHER PUBLICATIONS

Written Opinion issued in PCT/JP2019/048062 dated Mar. 10, 2020.
International Preliminary Report on Patentability completed by WIPO dated Jun. 16, 2021 in connection with International Patent Application No. PCT/JP2019/048062.

\* cited by examiner

LIQUID CRYSTAL COMPOSITION, METHOD FOR PRODUCING HIGH-MOLECULAR WEIGHT LIQUID CRYSTAL COMPOUND, LIGHT ABSORPTION ANISOTROPIC FILM, LAMINATE, AND IMAGE DISPLAY DEVICE

CROSS-REFERENCE TO RELATED APPLICATIONS

This application is a Continuation of PCT International Application No. PCT/JP2019/048062 filed on Dec. 9, 2019, which was published under PCT Article 21(2) in Japanese, and which claims priority under 35 U.S.C. § 119(a) to Japanese Patent Application No. 2018-239442 filed on Dec. 21, 2018. The above applications are hereby expressly incorporated by reference, in its their entirety, into the present application.

BACKGROUND OF THE INVENTION

1. Field of the Invention

The present invention relates to a liquid crystal composition, a method for producing a high-molecular weight liquid crystal compound, a light absorption anisotropic film, a laminate, and an image display device.

2. Description of the Related Art

In the related art, devices which are operated by different principles for each function have been used in a case where an attenuation function, a polarization function, a scattering function, a shielding function, or the like is required in relation to irradiated light including laser light and natural light. Therefore, products corresponding to the above-described functions have been manufactured through different manufacturing steps for each function.

For example, in liquid crystal display (LCD), a linearly polarizing plate or a circularly polarizing plate is used to control optical activity and a birefringence property in displaying. In addition, in organic light emitting diodes (OLEDs), a circularly polarizing plate is used to prevent external light from being reflected.

In the related art, iodine has been widely used as a dichroic substance in these polarizing plates (polarizing elements). However, a polarizing element using an organic dye as a dichroic substance instead of iodine has also been examined.

For example, WO2018/124198A (paragraph 0007, and the like) describes that in a liquid crystal composition containing a high-molecular weight liquid crystal compound and a dichroic substance, a light absorption anisotmpic film having a high alignment degree can be formed in a case a high-molecular weight liquid crystal compound having a repeating unit in which the difference between a log P value from a main chain to a spacer group and a log P value of a mesogenic group is 4 or more.

SUMMARY OF THE INVENTION

The inventors have examined the light absorption anisotropic film described in WO2018/124198A and found that depending on the kind of the high-molecular weight liquid crystal compound used for forming the light absorption anisotropic film, although a high alignment degree is exhibited, a liquid crystal composition containing a high-molecular weight liquid crystal compound is repelled on a base material, and thus problems such as the insufficient plane shape uniformity of the light absorption anisotropic film occur.

An object of the present invention is to provide a liquid crystal composition with which a light absorption anisotropic film that is excellent plane shape uniformity and has a high alignment degree can be formed, a method for producing a high-molecular weight liquid crystal compound, a light absorption anisotropic film, a laminate, and an image display device.

As a result of diligent studies to solve the above problems, the present inventors have found that in a case where a high-molecular weight liquid crystal compound that is blended together with a dichroic substance has repeating units (1) and (2), and the content of the repeating unit (1) is 90% by mass or more and the content of the repeating unit (2) is 10% by mass or less with respect to total content of all the repeating units contained in the high-molecular weight liquid crystal compound, a light absorption anisotropic film that is excellent in plane shape uniformity and has a high alignment degree can be formed, and have completed the present invention.

That is, the inventors of the present invention found that the above-described problems can be solved by the following configurations.

[1] A liquid crystal composition comprising a high-molecular weight liquid crystal compound; and a dichroic substance, in which the high-molecular weight liquid crystal compound is a copolymer containing a repeating unit (1) represented by Formula (1) described later and a repeating unit (2) represented by Formula (2), a content of the repeating unit (1) is 90% by mass or more with respect to a total mass of all repeating units contained in the high-molecular weight liquid crystal compound, and a content of the repeating unit (2) is 10% by mass or less with respect to the total mass of all the repeating units contained in the high-molecular weight liquid crystal compound, in Formula (1) described later, P1 represents a main chain of the repeating unit, L1 represents a single bond or a divalent linking group, SP1 represents a spacer group, M1 represents a mesogenic group having three or more cyclic structures, and T1 represents a terminal group, and in Formula (2) described later, P2 and P3 each independently represent a main chain of the repeating unit, L2 and L3 each independently represent a single bond or a divalent linking group, SP2 and SP3 each independently represent a single bond or a spacer group, M2 and M3 each independently represent a mesogenic group, and n and m each independently represent an integer of 0 or 1.

[2] The liquid crystal composition according to [1], in which a sum of n and m in Formula (2) described later is 1 or 2.

[3] The liquid crystal composition according to [1] or [2], in which a partial structure represented by $-(M2)_n-(M3)_m-$ in Formula (2) described later includes two or more cyclic structures.

[4] The liquid crystal composition according to any one of [1] to [3], in which in Formula (2) described later, P2 and P3 are the same group, both L2 and L3 are a single bond or the same group, both SP2 and SP3 are a single bond or the same group, and both M2 and M3 are the same group.

[5] The liquid crystal composition according to any one of [1] to [4], in which the content of the repeating unit (2) is 0.001% to 3% by mass with respect to the total mass of all repeating units contained in the liquid crystalline polymer compound.

[6] A method for producing a high-molecular weight liquid crystal compound, the method comprising a step of copolymerizing a monofunctional monomer and a polyfunctional monomer to obtain a high-molecular weight liquid crystal compound, in which a content of the monofunctional monomer is 90% by mass or more with respect to a content of all monomers that are used for polymerizing the high-molecular weight liquid crystal compound, and a content of the polyfunctional monomer is 10% by less or more with respect to the content of all the monomers that are used for polymerizing the high-molecular weight liquid crystal compound.

[7] The method for producing a high-molecular weight liquid crystal compound according to [6], in which the monofunctional monomer contains a mesogenic group.

[8] The method for producing a high-molecular weight liquid crystal compound according to [6] or [7], in which the monofunctional monomer is a compound represented by Formula (1a) described later, in Formula (1a) described later, P1a represents a polymerizable group, L1 represents a single bond or a divalent linking group, SP1 represents a spacer group, M1 represents a mesogenic group having three or more cyclic structures, and T1a represents a terminal group.

[9] The method for producing a high-molecular weight liquid crystal compound according to any one of [6] or [8], in which the polyfunctional monomer is a compound represented by Formula (2a) described later, in Formula (2a) described later, P2a and P3a each independently represent a polymerizable group, L2 and L3 each independently represent a single bond or a divalent linking group, SP2 and SP3 each independently represent a single bond or a spacer group, M2 and M3 each independently represent a mesogenic group, and n and m independently represent an integer of 0 or 1.

[10] The method for producing a high-molecular weight liquid crystal compound according to [9], in which a sum of n and m in Formula (2a) described later is 1 or 2.

[11] The method for producing a high-molecular weight liquid crystal compound according to [9] or [10], in which a partial structure represented by $-(M2)_n-(M3)_m-$ in Formula (2a) described later includes two or more cyclic structures.

[12] The method for producing a high-molecular weight liquid crystal compound according to any one of [8] to [11], in which in Formula (2a) described later, P2a and P3a are the same group, both L2 and L3 are a single bond or the same group, both SP2 and SP3 are a single bond or the same group, and M2 and M3 are the same group.

[13] The method for producing a high-molecular weight liquid crystal compound according to any one of [6] to [12], in which the content of the polyfunctional monomer is 0.001% to 3% by mass with respect to the content of all the monomers that are used for polymerizing the high-molecular weight liquid crystal compound.

[14] A light absorption anisotropic film which is formed from the liquid crystal composition according to any one of [1] to [5].

[15] A laminate comprising a base material; and the light absorption anisotropic film according to [14], which is provided on the base material.

[16] The laminate according to [15], further comprising: a V/4 plate which is provided on the light absorption anisotropic film.

[17] An image display device comprising the light absorption anisotropic film according to [14] or the laminate according to [15] or [16].

According to the present invention, it is possible to provide a liquid crystal composition with which a light absorption anisotropic film that is excellent plane shape uniformity and has a high alignment degree can be formed, a method for producing a high-molecular weight liquid crystal compound, a light absorption anisotropic film, a laminate, and an image display device.

DESCRIPTION OF THE PREFERRED EMBODIMENTS

In the following description, the present invention will be described in more detail.

The following description of constituent requirements is based on representative embodiments of the invention; however, the present invention is not limited thereto.

A numerical value range represented using "to" in the present specification means a range including the numerical values described before and after "to" as the lower limit and the upper limit respectively.

In this specification, the term (meth)acrylic acid is a generic term for "acrylic acid" and "methacrylic acid", and the term (meth)acryloyl is a generic term for "acryloyl" and "methacryloyl".

[Liquid Crystal Composition]

The liquid crystal compound according to the embodiment of the present invention is a liquid crystal composition containing a high-molecular weight liquid crystal compound and a dichroic substance, in which the liquid crystal composition is a copolymer of a repeating unit (1) represented by Formula (1) and a repeating unit (2) represented by Formula (2) described later, a content of the repeating unit (1) is 90% by mass or more with respect to a total mass of all repeating units contained in the high-molecular weight liquid crystal compound, and a content of the repeating unit (2) is 10% by mass or less with respect to the total mass of all the repeating units contained in the high-molecular weight liquid crystal compound.

According to the liquid crystal composition according to the embodiment of the present invention, it is possible to form a light absorption anisotropic film that is excellent in plane shape uniformity and has a high alignment degree. The details of the reason for the above are not clear; however, it is presumed as follows.

The repeating unit (2) is a unit that is introduced into a high-molecular weight liquid crystal compound by polymerizing a polyfunctional monomer. For this reason, it is considered that the high-molecular weight liquid crystal compound contains a high-molecular weight body in which a three-dimensionally crosslinked structure is formed by the repeating unit (2). Here, since the content of the repeating unit (2) is smaller than the content of the repeating unit (1), it is conceived that the high-molecular weight body containing the repeating unit (2) is contained at a low level in the liquid crystal composition.

It is presumed that in a case where such a high-molecular weight body is present at a low level, the repelling of the liquid crystal composition is suppressed, and thus the obtained light absorption anisotropic film is excellent in plane shape uniformity.

Further, since the content of the high-molecular weight body is small, it is presumed that the effect of excellent alignment degree exhibited by the repeating unit (1) could be maintained.

[Synthesis of High-Molecular Weight Liquid Crystal Compound]

The high-molecular weight liquid crystal compound is a copolymer of a repeating unit (1) and a repeating unit (2) and may be any polymer of a block polymer, an alternating polymer, a random polymer, a graft polymer, and the like.

<Repeating Unit (1)>

The high-molecular weight liquid crystal compound contained in the liquid crystal composition according to the embodiment of the present invention contains a repeating unit (1) represented by Formula (1).

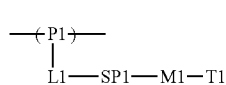
(1)

In Formula (1), P1 represents a main chain of the repeating unit, L1 represents a single bond or a divalent linking group, SP1 represents a spacer group, M1 represents a mesogenic group having three or more cyclic structures, and T1 represents a terminal group.

Specific examples of the main chain of the repeating unit represented by P1 include groups represented by Formulae (P1-A) to (P1-D). Among these, a group represented by Formula (P1-A) is preferable from the viewpoint of the diversity of monomers as raw materials and ease of handling.

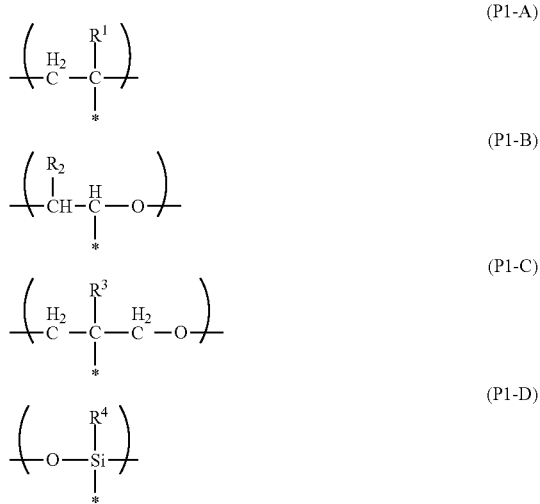

In Formulae (P1-A) to (P1-D), "*" represents a bonding position to L1 in Formula (1). In Formulae (P1-A) to (P1-D), $R^1$, $R^2$, $R^3$, and $R^4$ each independently represent a hydrogen atom, a halogen atom, an alkyl group having 1 to 10 carbon atoms, or an alkoxy group having 1 to 10 carbon atoms. The alkyl group may be a linear or branched alkyl group or may be an alkyl group (a cycloalkyl group) having a cyclic structure. The alkyl group preferably has 1 to 5 carbon atoms.

The group represented by Formula (P1-A) is preferably an unit of a partial structure of a poly(meth)acrylic acid ester obtained by polymerizing a (meth)acrylic acid ester.

The group represented by Formula (P1-B) is preferably an ethylene glycol unit formed by subjecting an epoxy group of a compound having an epoxy group to ring-opening polymerization.

The group represented by Formula (P1-C) is preferably a propylene glycol unit formed by subjecting an oxetane group of a compound having an oxetane group to ring-opening polymerization.

The group represented by Formula (P1-D) is preferably a siloxane unit of a polysiloxane obtained by polycondensation of a compound having at least one of an alkoxysilyl group or a silanol group. Here, examples of the compound having at least one of an alkoxysilyl group or a silanol group include a compound having a group represented by Formula $SiR^4(OR^5)_2$—. In the formula, R is synonymous with $R^4$ in (P1-D), and a plurality of $R^5$'s each independently represent a hydrogen atom or an alkyl group having 1 to 10 carbon atoms.

L1 is a single bond or a divalent linking group.

Examples of the divalent linking group represented by L1 include —C(O)O—, —OC(O)—, —O—, —S—, —C(O)NR$^3$—, —NR$^3$C(O)—, —S(O)$_2$—, and —NR$^3$R$^4$—. In the formula, $R^3$ and $R^4$ each independently represent a hydrogen atom or an alkyl group having 1 to 6 carbon atoms which may have a substituent (for example, a substituent W which will be described later). In the specific examples of the divalent linking group, a left bonding hand is bonded to P1, and a right bonding hand is bonded to SP1.

In a case where P1 is a group represented by Formula (P1-A), L1 is preferably a group represented by —C(O)O—.

In a case where P1 is a group represented by any one of Formula (P1-B), (P1-C), and (P1-D), L1 is preferably a single bond.

The spacer group represented by SP1 preferably includes at least one group selected from the group consisting of an oxyethylene structure, an oxypropylene structure, a polysiloxane structure, and a fluorinated alkylene structure, or a linear branched alkylene group having 2 to 20 carbon atoms. However, the alkylene group may contain —O—, —O—CO—, —CO—O—, or —O—CO—O—.

The spacer group represented by SP1 preferably includes at least one group selected from the group consisting of an oxyethylene structure, an oxypropylene structure, a polysiloxane structure, and a fluorinated alkylene structure due to the reason of the easy exhibition of liquid crystallinity, raw material availability, and the like.

Here, the oxyethylene structure represented by SP1 is preferably a group represented by *—(CH$_2$—CH$_2$O)$_{n1}$—*. In the formula, n1 represents an integer of 1 to 20, and * represents a bonding position to L1 or M1. n1 is preferably an integer of 2 to 10, more preferably an integer of 2 to 4, and most preferably 3, due to the reason that the effects of the present invention are more excellent.

The oxypropylene structure represented by SP1 is preferably a group represented by *—(CH(CH$_3$)—CH$_2$O)$_{n2}$—*. In the formula, n2 represents an integer of 1 to 3, and * represents a bonding position to L1 or M1.

The polysiloxane structure represented by SP1 is preferably a group represented by *—(Si(CH$_3$)$_2$—O)$_{n3}$—*. In the formula, n3 represents an integer of 6 to 10, and * represents a bonding position to L1 or M1.

The fluorinated alkylene structure represented by SP1 is preferably a group represented by *—(CF$_2$—CF$_2$)$_{n4}$—*. In the formula, n4 represents an integer of 6 to 10, and * represents a bonding position to L1 or M1.

The mesogenic group represented by M1 is a group indicating the main skeleton of liquid crystal molecules contributing to the formation of the liquid crystal. The liquid crystal molecule exhibits liquid crystallinity in an intermediate state (a mesophase) between a crystalline state and an isotropic liquid state. The mesogenic group is not particularly limited, and for example, the description on pages 7 to 16 of "Flussige Kristalle in Tabellen II" (VEB Deutsche Verlag fur Grundstoff Industrie, Leipzig, 1984) and the description in Chapter 3 of Liquid Crystal Handbook (Maruzen, 2000) edited by Liquid Crystal Handbook Editing Committee can be referred to.

The mesogenic group represented by M1 contains 3 or more cyclic structures, preferably 3 to 5 cyclic structures, more preferably 3 to 4 cyclic structures, and particularly preferably 3 cyclic structures.

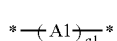
(M1-A)

(M1-B)

In Formula (M1-A), A1 is a divalent group selected from the group consisting of an aromatic hydrocarbon group, a heterocyclic group, and an alicyclic group. These groups may be substituted with a substituent such as an alkyl group, a fluorinated alkyl group, an alkoxy group or a substituent W which will be described later.

The divalent group represented by A1 is preferably a 4- to 6-membered ring. The divalent group represented by A1 may be monocyclic or condensed.

* represents a bonding position to SP1 or T1.

Examples of the divalent aromatic hydrocarbon group represented by A1 include a phenylene group, a naphthylene group, a fluorene-diyl group, anthracene-diyl group, and a tetracene-diyl group, and from the viewpoint of the diversity of the design of a mesogenic skeleton and raw material availability, a phenylene group or a naphthylene group is preferable, and a phenylene group is more preferable.

The divalent heterocyclic group represented by A1 may be aromatic or non-aromatic; however, it is preferably a divalent aromatic heterocyclic group from the viewpoint of a further improvement in the alignment degree.

Examples of the atom other than the carbon atoms of the divalent aromatic heterocyclic group include a nitrogen atom, a sulfur atom, and an oxygen atom. In a case where the aromatic heterocyclic group has a plurality of ring-constituting atoms other than the carbon atom, these may be the same or different from each other.

Specific examples of the divalent aromatic heterocyclic group include a pyridylene group (a pyridine-diyl group), a pyridazine-diyl group, an imidazole-diyl group, a thienylene (a thiophene-diyl group), a quinolylene group (a quinoline-diyl group), an isoquinolylene group (an isoquinoline-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 3 to 10. A plurality of A1's may be the same or different from each other.

In Formula (M1-B), A2 and A3 each independently represent a divalent group selected from the group consisting of an aromatic hydrocarbon group, a heterocyclic group, and an alicyclic group. Since specific examples and preferred aspects of A2 and A3 are the same as those of A1 of Formula (M1-A), the description thereof will be omitted.

In Formula (M1-B), a2 represents an integer of 2 to 10, a plurality of A2's may be the same or different from each other, and a plurality of LA1's may be the same or different from each other. a2 is preferably an integer of 2 or more due to the reason that the effects of the present invention are more excellent.

In Formula (M1-B), the plurality of LA1's each independently represent a single bond or a divalent linking group, and at least one of the plurality of LA1's is a divalent linking group. In a case where a2 is 2, it is preferable that one of the two LA1s is a divalent linking group and the other is a single bond due to the reason that the effects of the present invention are more excellent.

Examples of the divalent linking group represented by LA1 in Formula (M1-B) include —O—, —(CH$_2$)$_g$—, —(CF$_2$)$_g$—, —Si(CH$_3$)$_2$—, —(Si(CH$_3$)$_2$O)$_g$, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)—C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent hydrogen, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Of them, —C(O)O— is preferable due to the reason that the effects of the present invention are more excellent. LA1 may be a group formed by combining two or more of the above groups.

Specific examples of M1 include the following structures. In the following specific examples, "Ac" represents an acetyl group.

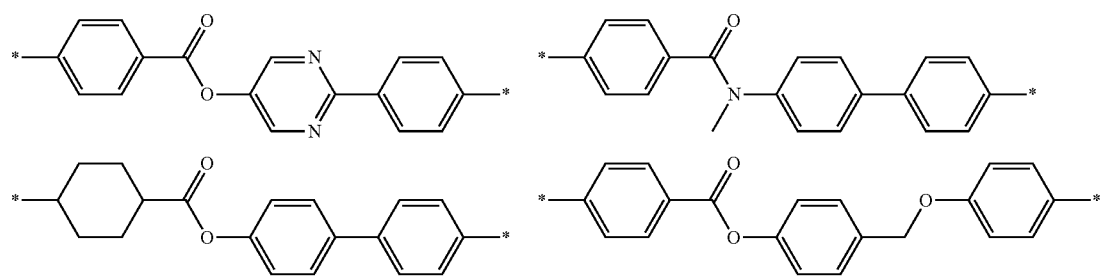

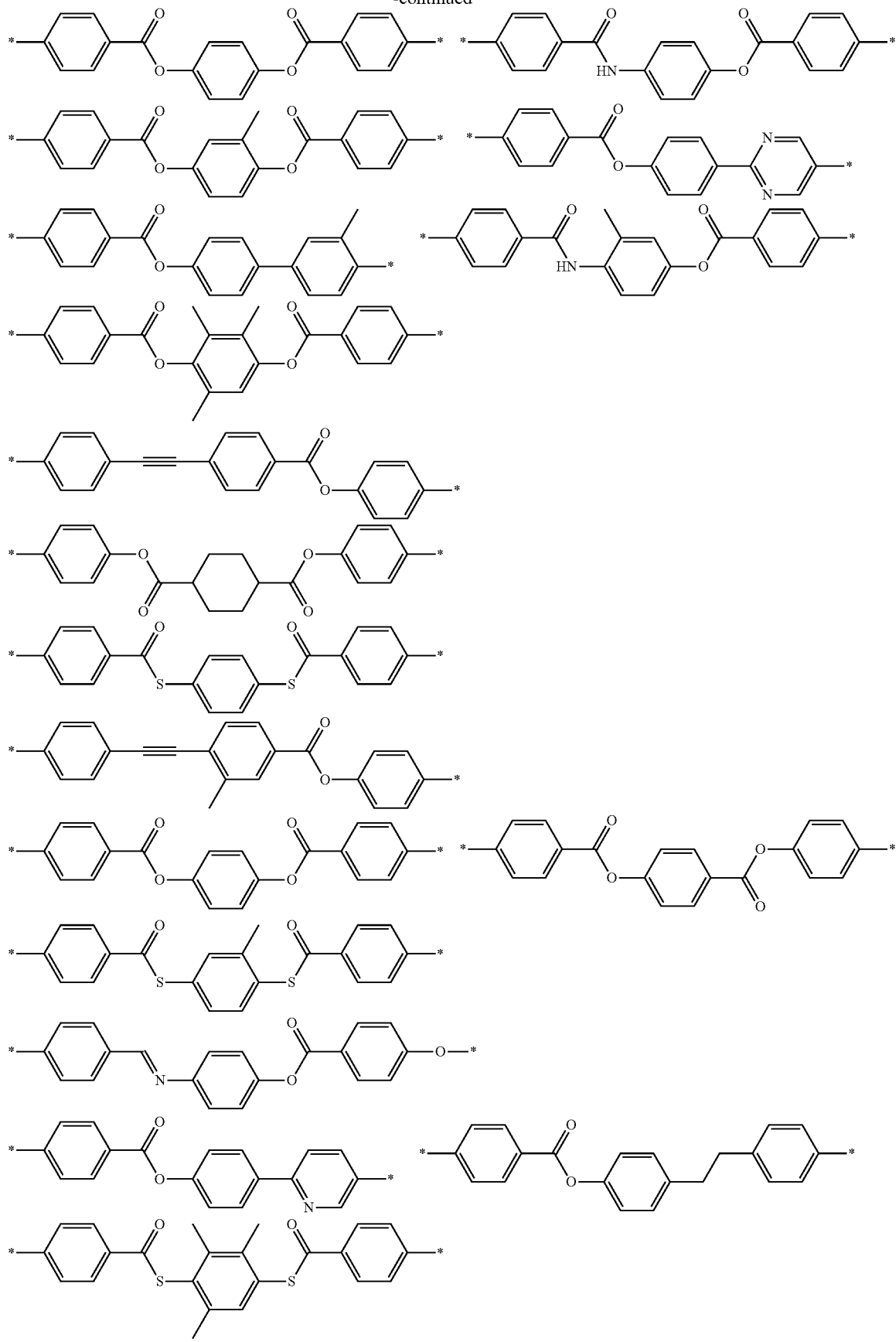

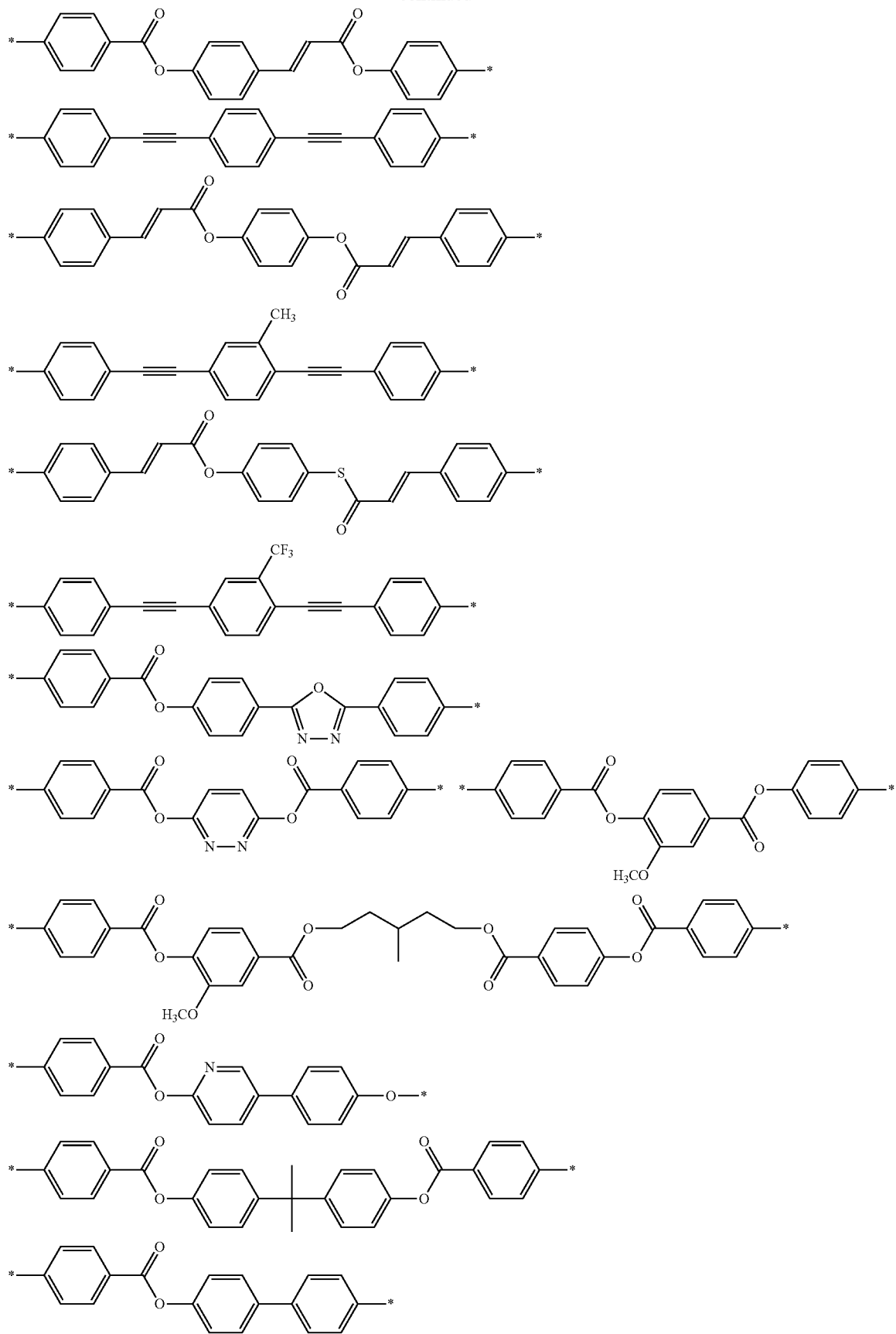

-continued
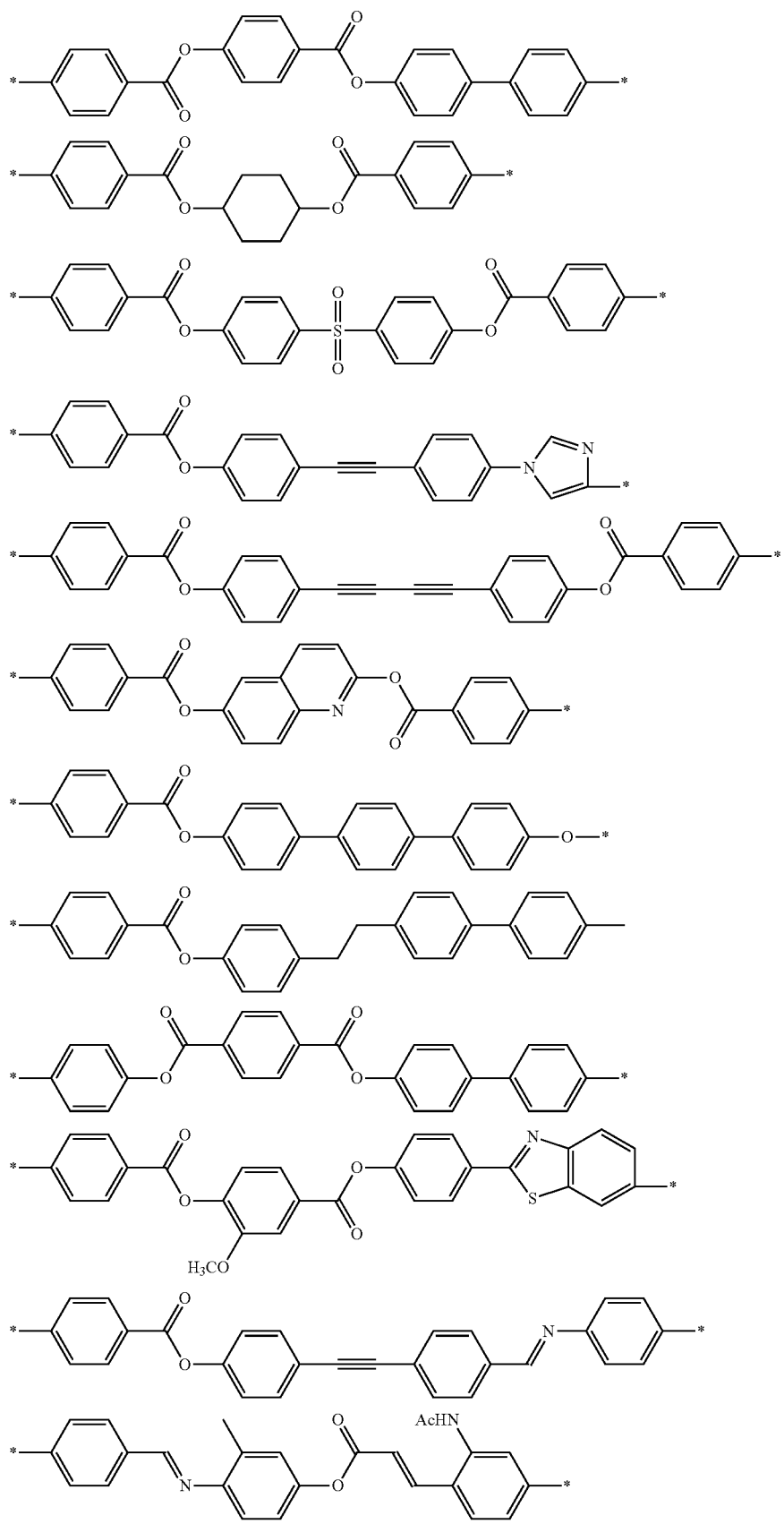

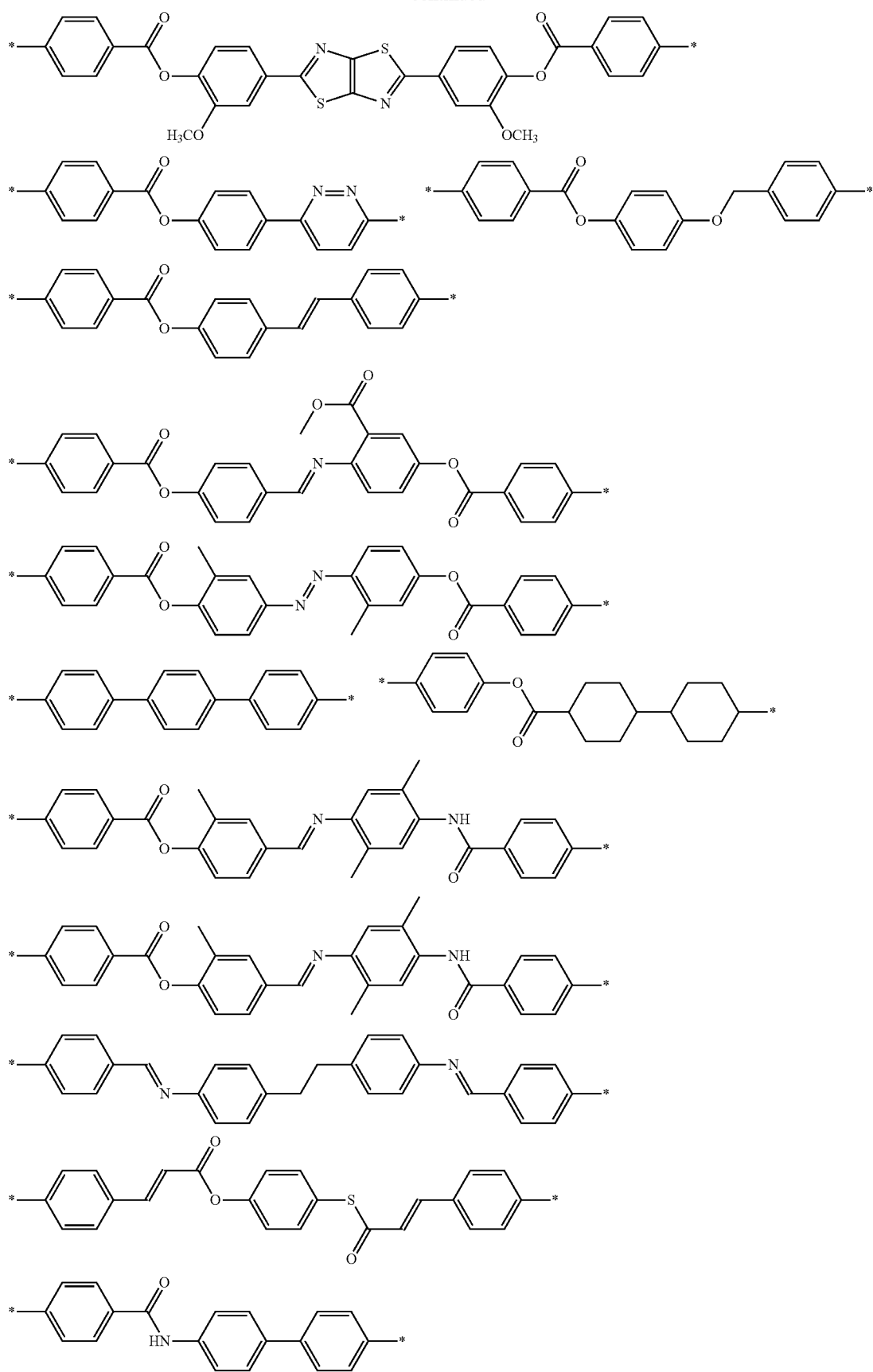

-continued

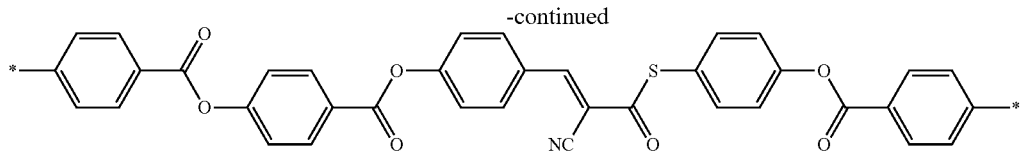

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. T1 may be a group formed by combining two or more of the above groups.

Examples of the (meth)acryloyloxy group-containing group include a group represented by -L-A (L represents a single bond or a linking group, where specific examples of the linking group are the same as those of L1 and SP1 described above, and A represents a (meth)acryloyloxy group).

T1 is preferably an alkoxy group having 1 to 10 carbon atoms, more preferably an alkoxy group having 1 to 5 carbon atoms, and still more preferably a methoxy group, due to the reason that the effects of the present invention are more excellent. These terminal groups may be further substituted with these groups or the polymerizable groups described in JP2010-244038A.

The number of atoms in the main chain of T1 is preferably 1 to 20, more preferably 1 to 15, still more preferably 1 to 10, and particularly preferably 1 to 7, due to the reason that the effects of the present invention are more excellent. In a case where the number of atoms in the main chain of T1 is 20 or less, the alignment degree of a light absorption anisotropic film is further improved. Here, the "main chain" of T1 means the longest molecular chain bonded to M1, and hydrogen atoms are not counted as the atoms in the main chain of T1. For example, in a case where T1 is an n-butyl group, the main chain has 4 atoms, and in a case where T1 is a sec-butyl group, the main chain has 3 atoms.

The content of the repeating unit (1) is 90% by mass or more with respect to the total repeating units (100% by mass) contained in the high-molecular weight liquid crystal compound, and from the viewpoint that the effects of the present invention are more excellent, preferably 95% to 99.999% by mass and more preferably 97% to 99.95% by mass.

In the present invention, the content of each of the repeating units contained in the high-molecular weight liquid crystal compound is calculated based on the charged amount (mass) of each of the monomers used to obtain each of the repeating units.

The high-molecular weight liquid crystal compound may contain only one kind of repeating unit (1) or may contain two or more kinds thereof. In a case where the high-molecular weight liquid crystal compound contains two or more kinds of repeating units (1), there is an advantage in that the solubility of the high-molecular weight liquid crystal compound in a solvent is improved and the liquid crystal phase transition temperature is easily adjusted. In a case where two or more kinds of repeating units (1) are contained, the total amount thereof is preferably within the above range.

In a case where two or more kinds of repeating units (1) are contained, a repeating unit (1) in which T1 does not include a polymerizable group and a repeating unit (1) in which T1 includes a polymerizable group may be used in combination. This further improves the curability of a light absorption anisotropic film.

In this case, in the high-molecular weight liquid crystal compound, a ratio of the repeating unit (1) in which T1 includes a polymerizable group to the repeating unit (1) in which T1 does not include a polymerizable group (repeating unit (1) in which T1 includes polymerizable group/repeating unit (1) in which T1 does not include polymerizable group) is preferably 0.005 to 4, and more preferably 0.01 to 2.4 in terms of the mass ratio. In a case where the mass ratio is 4 or less, there is an advantage in that the alignment degree is excellent. In a case where the mass ratio is 0.05 or more, the curability of a light absorption anisotropic film is further improved.

<Repeating unit (2)>

The high-molecular weight liquid crystal compound contained in the liquid crystal composition according to the embodiment of the present invention contains a repeating unit (2) represented by Formula (2).

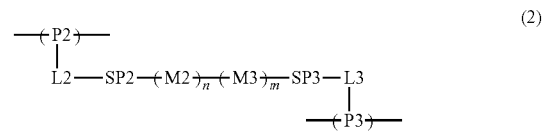

In Formula (2) described later, P2 and P3 each independently represent a main chain of the repeating unit, L2 and L3 each independently represent a single bond or a divalent linking group, SP2 and SP3 each independently represent a single bond or a spacer group, M2 and M3 each independently represent a mesogenic group, and n and m each independently represent an integer of 0 or 1.

Since specific examples and preferred aspects of P2 and P3 are the same as those of P1 of Formula (1), the description thereof will be omitted. P2 and P3 may be the same group or groups different from each other; however, they are preferably the same group from the viewpoint that the alignment degree of the light absorption anisotropic film is further improved.

Since specific examples and preferred aspects of L2 and L3 in a case of being a divalent linking group are the same as those of L1 of Formula (1), the description thereof will be omitted. Both L2 and L3 may be a single bond, the same group, or groups different from each other; however, from the viewpoint that the alignment degree of the light absorption anisotropic film is further improved, both L2 and L3 are preferably a single bond or the same group and more preferably the same group.

Since specific examples and preferred aspects of SP2 and SP3 in a case of being a spacer group are the same as those of SP1 of Formula (1), the description thereof will be omitted. Both SP2 and SP3 may be a single bond, the same group, or groups different from each other; however, from the viewpoint that the alignment degree of the light absorption anisotropic film is further improved, both SP2 and SP3 are preferably a single bond or the same group and more preferably the same group.

Here, the same group in Formula (2) means that the group has the same chemical structure regardless of the direction in which each group is bonded. For example, SP2 is *—$CH_2$—$CH_2$—O—** (* represents a bonding position to L2, ** represents a bonding position to M2), and SP3 is *—O—$CH_2$—$CH_2$—** (* represents a bonding position to M3, and ** represents a bonding position to L3), SP2 and SP3 are the same group.

n and m are each independently an integer of 0 or 1 and are preferably 1 from the viewpoint of further improving the alignment degree of the light absorption anisotropic film.

n and m may be the same or different from each other; however, they are preferably 1 from the viewpoint of further improving the alignment degree of the light absorption anisotropic film.

The sum of n and m is preferably 1 or 2 and more preferably 2 (that is, the repeating unit represented by Formula (2) is a mesogenic group) from the viewpoint of further improving the alignment degree of the light absorption anisotropic film.

The definition of the mesogenic group represented by M2 and M3 is the same as the definition of the mesogenic group described by M1 in Formula (1).

The partial structure represented by -(M2)-(M3)$_m$- preferably has a cyclic structure from the viewpoint of further improving the alignment degree of the light absorption anisotropic film. In this case, the number of cyclic structures in the partial structure represented by -(M2)$_n$-(M3)$_m$- is preferably 2 or more, more preferably 2 to 8, still more preferably 2 to 6, particularly preferably 2 to 4, and most preferably 4, from the viewpoint of further improving the alignment degree of the light absorption anisotropic film.

The mesogenic groups represented by M2 and M3 each independently preferably contain one or more cyclic structures, more preferably two to four cyclic structures, and particularly preferably two or three cyclic structures, from the viewpoint of further improving the alignment degree of the light absorption anisotropic film.

Specific examples of the cyclic structure include an aromatic hydrocarbon group, a heterocyclic group, and an alicyclic group, and among these, an aromatic hydrocarbon group is preferable.

M2 and M3 may be the same group or groups different from each other; however, they are preferably the same group from the viewpoint that the alignment degree of the light absorption anisotropic film is further improved.

The mesogenic group represented by M2 and M3 is preferably a group represented by Formula (M2-A) or Formula (M2-B) and more preferably a group represented by Formula (M2-B), from the viewpoints of the exhibition of liquid crystallinity, the adjustment of the liquid crystal phase transition temperature, and the availability and the synthetic suitability of raw materials, and due to the fact that the effect of the present invention is more excellent.

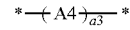   (M2-A)

   (M2-B)

In Formula (M2-A), A4 is a divalent group selected from the group consisting of an aromatic hydrocarbon group, a heterocyclic group, and an alicyclic group. These groups may be substituted with a substituent such as an alkyl group, a fluorinated alkyl group, an alkoxy group or a substituent W which will be described later.

The divalent group represented by A4 is preferably a 4- to 6-membered ring. The divalent group represented by A4 may be monocyclic or condensed.

* represents a binding position to SP2 or T2 in a case where the mesogenic group is represented by M2, and represents a binding position to SP3 or T3 in a case where the mesogenic group is represented by M3.

Specific examples and preferred aspects of the divalent aromatic hydrocarbon group, the divalent heterocyclic group, and the divalent alicyclic group, which are represented by A4, are the same as those of A1 in Formula (M1-A) described above, the description thereof will be omitted.

In Formula (M2-A), a3 represents an integer of 1 to 4 (preferably 2 to 4 and more preferably 2). In a case where a3 is 2 or more, a plurality of A4's may be the same or different from each other.

In Formula (M2-B), A5 and A6 each independently represent a divalent group selected from the group consisting of an aromatic hydrocarbon group, a heterocyclic group, and an alicyclic group. Since specific examples and preferred aspects of A5 and A6 are the same as those of A4 of Formula (M2-A), the description thereof will be omitted.

In Formula (M2-B), a4 represents an integer of 1 to 3, and in a case where a4 is 2 or more, a plurality of A5's may be the same or different from each other, and a plurality of LA2's may be the same or different each other. a4 is preferably an integer of 1 or more due to the reason that the effects of the present invention are more excellent.

In Formula (M2-B), in a case where a4 is 1, LA2 is a divalent linking group. In a case where a4 is 2 or more, a plurality of LA2's each independently represent a single bond or a divalent linking group, and at least one of the plurality of LA2's is a divalent linking group.

Specific examples and preferred aspects of the divalent linking group represented by LA2 in Formula (M2-B) are the same as those of LA1 in Formula (M1-A) described above, the description thereof will be omitted.

Specific examples of M2 and M3 include the following structures. In the following specific examples, "Ac" represents an acetyl group.

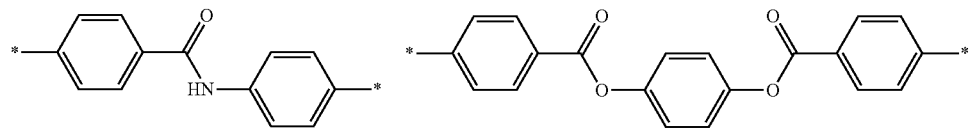

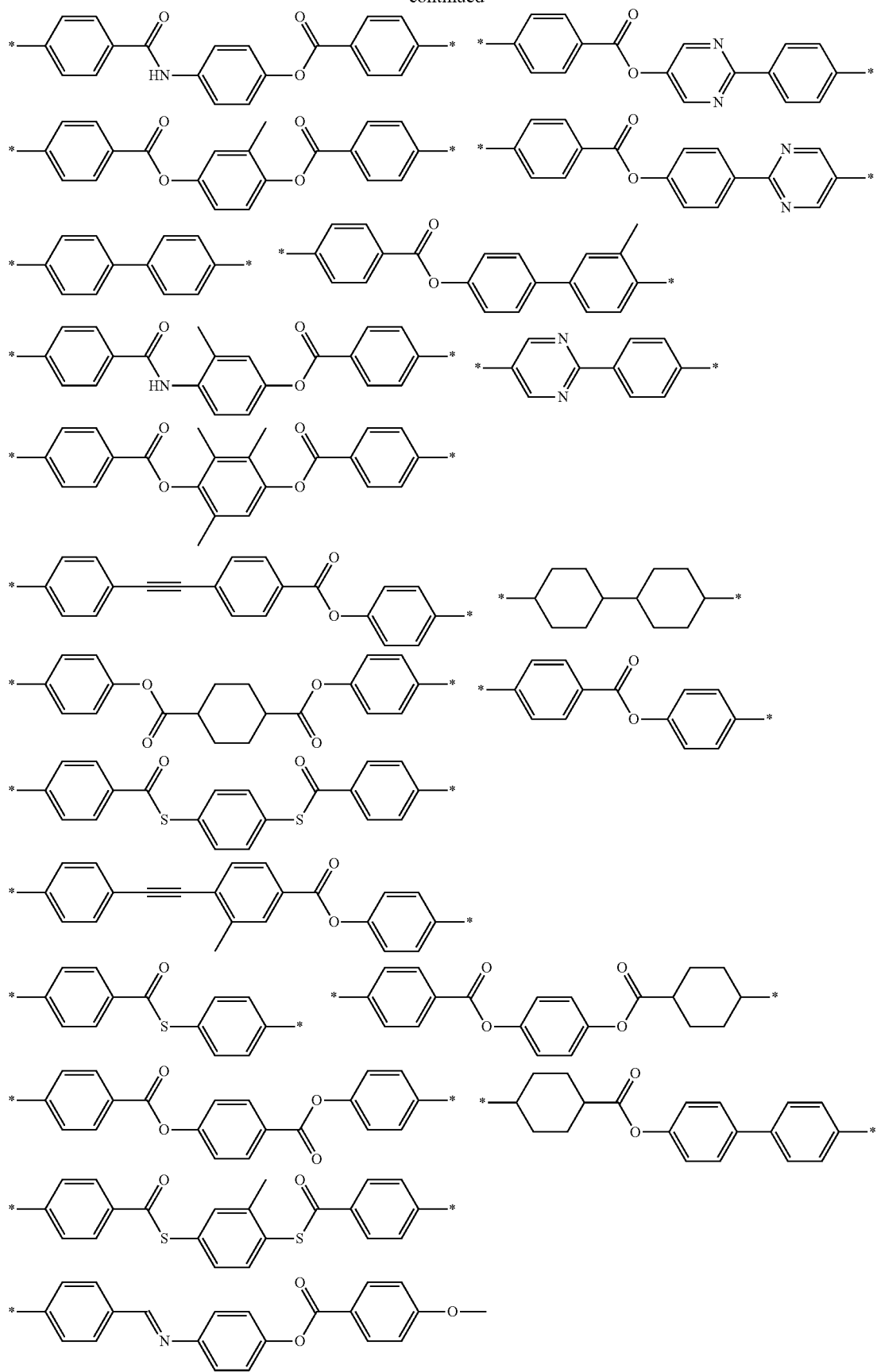

-continued
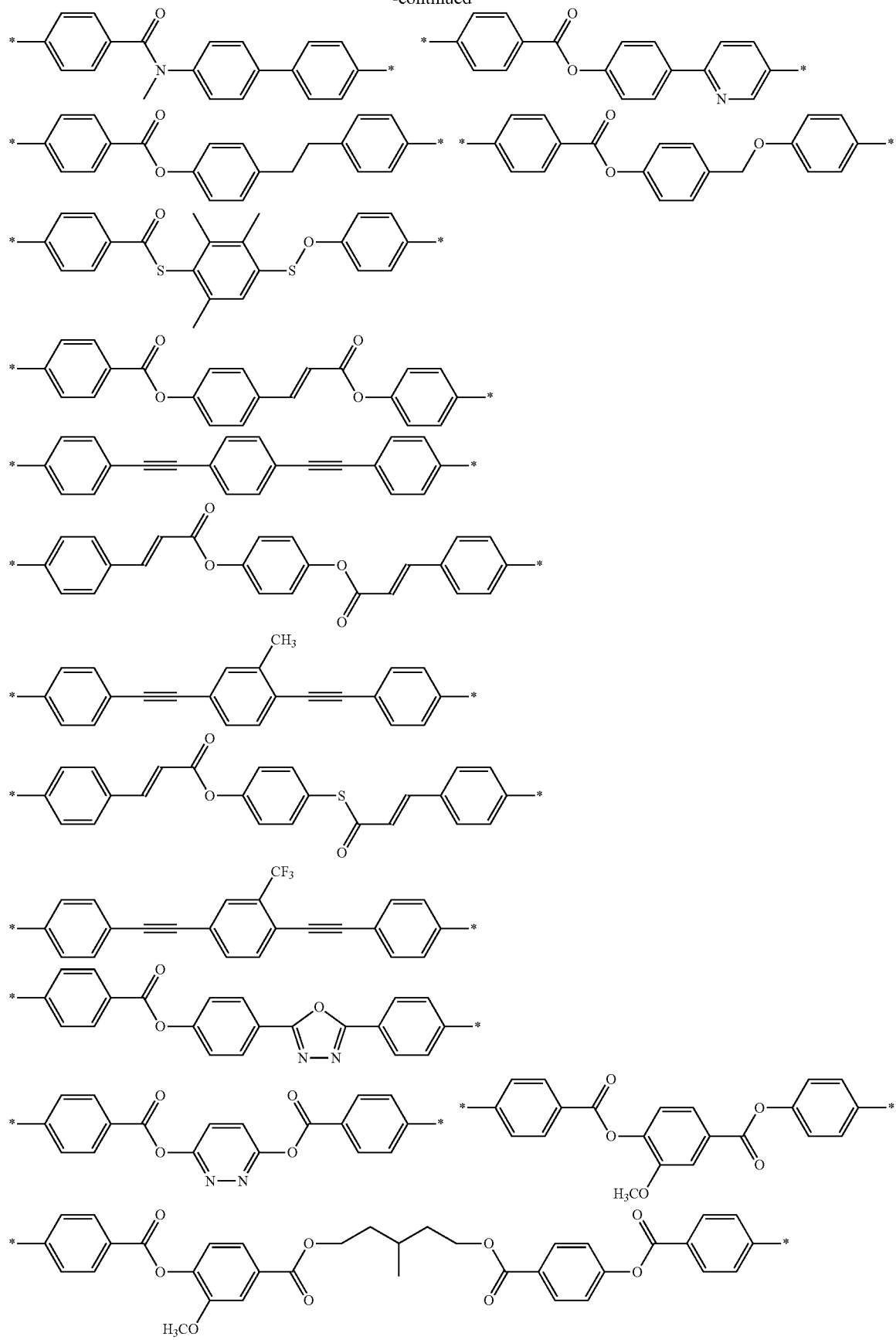

-continued
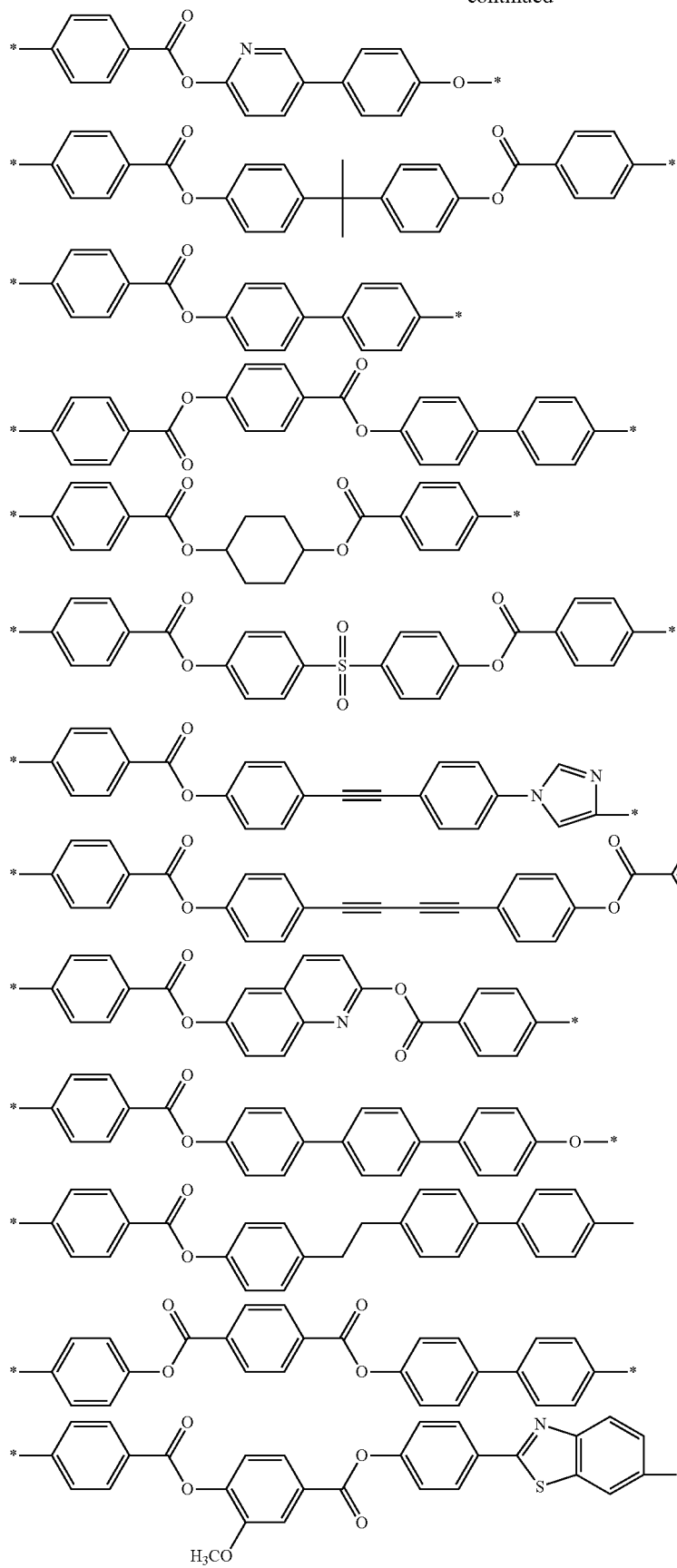

-continued
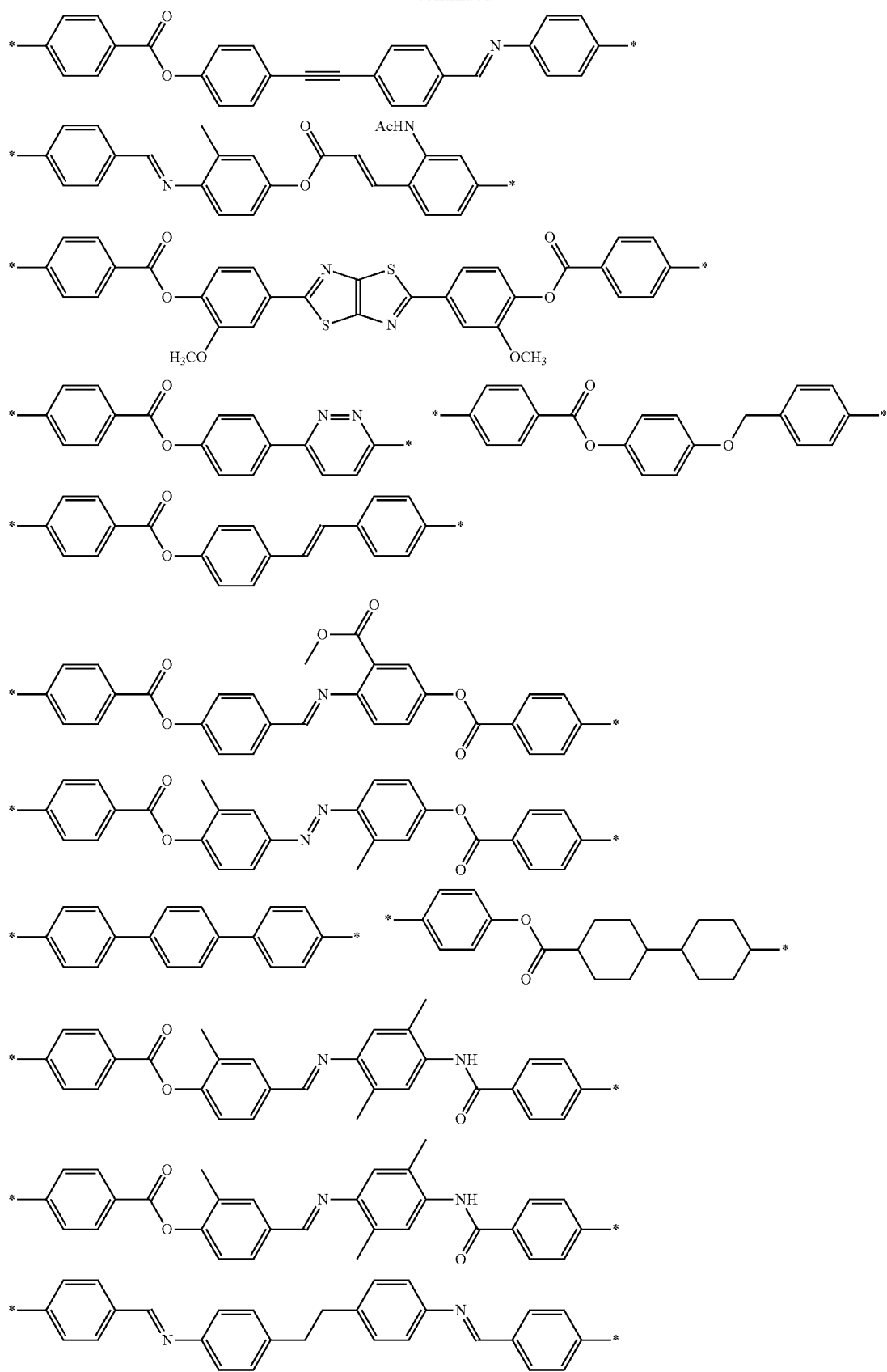

-continued

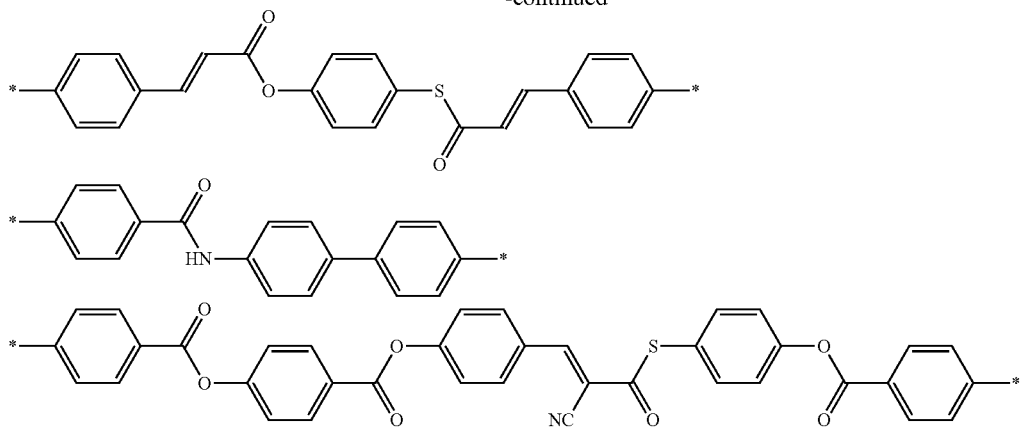

Particularly, in the repeating unit (2), P2 and P3 are the same group, both 12 and L3 are a single bond or the same group, both SP2 and SP3 are a single bond or the same group, and both M2 and M3 are the same group. This further improves the alignment degree of a light absorption anisotropic film.

The content of the repeating unit (2) is 10% by mass or less with respect to the total repeating units (100% by mass) contained in the high-molecular weight liquid crystal compound, and from the viewpoint that the effects of the present invention are more excellent, preferably 0.001% to 5% by mass and more preferably 0.05% to 3% by mass.

The high-molecular weight liquid crystal compound may contain only one kind of repeating unit (2) or two or more kinds of repeating units (2). In a case where two or more kinds of repeating units (2) are contained, the total amount thereof is preferably within the above range.

<Substituent W>

The substituent W in the present specification is described.

Examples of the substituent W include a halogen atom, an alkyl group (for example, a tert-butyl group)(including a cycloalkyl group, a bicycloalkyl group, and a tricycloalkyl group), and an alkenyl group (including a cycloalkenyl group and a bicycloalkenyl group).), an alkynyl group, an aryl group, a heterocyclic group (may also be referred to as heterocyclic group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, a acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, an ureido group, a boronic acid group (—B(OH)$_2$), a phosphato group (—OPO(OH)$_2$), a sulfato group (—OSO$_3$H), and other known substituents.

The details of the substituent are described in paragraph [0023] of JP2007-234651A.

<Physical Properties>

The weight-average molecular weight (Mw) of the high-molecular weight liquid crystal compound is preferably 1,000 to 500,000 and more preferably 2,000 to 300,000. In a case where Mw of the high-molecular weight liquid crystal compound is within the above range, the high-molecular weight liquid crystal compound is easily handled.

Particularly, from the viewpoint of suppressing cracking at the time of coating, the weight-average molecular weight (Mw) of the high-molecular weight liquid crystal compound is preferably 10,000 or more and more preferably 10,000 to 300,000.

From the viewpoint of the temperature latitude of the alignment degree, the weight-average molecular weight (Mw) of the high-molecular weight liquid crystal compound is preferably less than 10,000, and more preferably 2,000 to less than 10,000.

Here, in the present invention, the weight-average molecular weight and the number-average molecular weight are values measured by gel permeation chromatography (GPC).

Solvent (eluent): N-methylpyrrolidone
Device name: TOSOH HLC-8220GPC
  Column: TOSOH TSK gel Super AWM-H (6 mm×15 cm) (three columns are connected and used)
Column temperature: 25° C.
Sample concentration: 0.1% by mass
Flow rate: 0.35 mL/min
Calibration curve: A calibration curve obtained using seven TSK standard polystyrene samples, manufactured by TOSOH Corporation, in a range of Mw=2,800,000 to 1,050 (Mw/Mn=1.03 to 1.06) is used.

The high-molecular weight liquid crystal compound may exhibit any liquid crystallinity of nematic liquid crystallinity or smectic liquid crystallinity; however, the high-molecular weight liquid crystal compound preferably exhibits at least nematic liquid crystallinity.

The temperature range in which a nematic phase is presented is preferably 23° C. of room temperature to 450° C. and is more preferably 50° C. to 400° C. from the viewpoint of handling and manufacturing suitability.

[Dichroic Substance]

The dichroic substance contained in the liquid crystal composition according to the embodiment of the present invention is not particularly limited, and examples thereof include a visible light-absorbing substance (a dichroic dye), a luminescent substance (a fluorescent substance, a phosphorescent substance, or the like), an ultraviolet light-absorbing substance, an infrared light-absorbing substance, a nonlinear optical substance, a carbon nanotube, and an inorganic substance (for example, a quantum rod), and a conventionally known dichroic substance (a dichroic dye) can be used.

Specific examples of the dichroic substance include dichroic dyes described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0022] to [0080] of JP2015-001425A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252.

In the present invention, two or more kinds of dichroic substances may be used in combination. For example, from the viewpoint of making a color of the light absorption anisotropic film close to black, at least one kind of dye compound having a maximum absorption wavelength in a wavelength range of 370 to 550 nm, and at least one kind of dye compound having a maximum absorption wavelength in a wavelength range of 500 to 700 nm are preferably used in combination.

In the present invention, the dichroic substance preferably has a crosslinkable group due to the reason the pressing resistance is further improved.

Specific examples of the crosslinkable group include a (meth)acryloyl group, an epoxy group, an oxetanyl group, and a styryl group, and among these, a (meth)acryloyl group is preferable.

The content of the dichroic substance is preferably 2 to 400 parts by mass, more preferably 3 to 300 parts by mass, and still more preferably 4 to 200 parts by mass, with respect to 100 parts by mass of the high-molecular weight liquid crystal compound, from the viewpoint that the balance between the alignment degree and uniformity of the light absorption anisotropic film is improved.

[Polymerization Initiator]

The liquid crystal composition according to the embodiment of the present invention preferably contains a polymerization initiator.

The polymerization initiator is not particularly limited; however, a photosensitive compound, that is, a photopolymerization initiator is preferable.

As the photopolymerization initiator, various kinds of compounds can be used without particular limitations. Examples of the photopolymerization initiator include α-carbonyl compounds (the specifications of U.S. Pat. Nos. 2,367,661A and 2,367,670A), an acyloin ether (the specification of U.S. Pat. No. 2,448,828A), an aromatic acyloin compound substituted with α-hydrocarbon (the specification of U.S. Pat. No. 2,722,512A), polynuclear quinone compounds (the specifications of U.S. Pat. Nos. 3,046,127A and 2,951,758A), a combinations of a triarylimidazole dimer and a p-aminophenyl ketone (the specification of U.S. Pat. No. 3,549,367A), acridine and a phenazine compound (the specifications of JP1985-105667A (JP-S60-105667A) and U.S. Pat. No. 4,239,850A), an oxadiazole compound (the specification of U.S. Pat. No. 4,212,970A), and acylphosphine oxide compounds (JP1988-040799B (JP-S63-040799B), JP1993-029234B (JP-H5-029234B), JP1998-095788A (JP-H10-095788A), and JP1998-029997A (JP-H110-029997A)).

As such a photopolymerization initiator, a commercially available product can also be used, and examples thereof include IRGACURE 184, 907, 369, 651, 819, OXE-01, and OXE-02, which are manufactured by BASF SE.

In a case where the liquid crystal composition according to the embodiment of the present invention contains a polymerization initiator, the content of the polymerization initiator is preferably 0.01 to 30 parts by mass, and more preferably 0.1 to 15 parts by mass with respect to a total of 100 parts by mass of the dichroic substance and the high-molecular weight liquid crystal compound in the liquid crystal composition. In a case where the content of the polymerization initiator is 0.01 parts by mass or more, the durability of a light absorption anisotropic film is improved, and in a case where the content of the polymerization initiator is 30 parts by mass or less, the alignment of a light absorption anisotropic film is improved.

[Solvent]

From the viewpoint of workability and the like, the liquid crystal composition according to the embodiment of the present invention preferably contains a solvent.

Examples of the solvent include organic solvents such as ketones (for example, acetone, 2-butanone, methyl isobutyl ketone, cyclopentanone, and cyclohexanone), ethers (for example, dioxane, tetrahydrofuran, 2-methyltetrahydrofuran, cyclopentyl methyl ether, tetrahydropyran, and dioxolan), aliphatic hydrocarbons (for example, hexane), alicyclic hydrocarbons (for example, cyclohexane), aromatic hydrocarbons (for example, benzene, toluene, xylene, and trimethyl benzene), halocarbons (for example, dichloromethane, trichloromethane, dichloroethane, dichlorobenzene, and chlorotoluene), esters (for example, methyl acetate, ethyl acetate, butyl acetate, and ethyl lactate), alcohols (for example, ethanol, isopropanol, butanol, cyclohexanol, isopentyl alcohol, neopentyl alcohol, diacetone alcohol, and benzyl alcohol), cellosolves (for example, methyl cellosolve, ethyl cellosolve, and 1,2-dimethoxyethane), cellosolve acetates, sulfoxides (for example, dimethyl sulfoxide), amides (for example, dimethylformamide, dimethylacetamide, N-methylpyrrolidone, and N-ethylpyrrolidone), and heterocyclic compounds (for example, pyridine), and water. These solvents may be used alone, or two or more thereof may be used in combination.

Among these solvents, ketones (particularly, cyclopentanone and cyclohexanone), ethers (particularly, tetrahydrofuran, cyclopentyl methyl ether, tetrahydropyran, and dioxolan), or amides (particularly, dimethylformamide, dimethylacetamide, N-methylpyrrolidone, and N-ethylpyrrolidone) are preferable from the viewpoint of utilizing the effect that the solubility is excellent.

In a case where the liquid crystal composition according to the embodiment of the present invention contains a solvent, the content of the solvent is preferably 80% to 99% by mass, more preferably 83% to 98% by mass, and still more preferably 85% to 96% by mass with respect to the total mass of the liquid crystal composition.

[Interface Improver]

The liquid crystal composition according to the embodiment of the present invention preferably contains an interface improver. In a case where an interface improver is contained, it is expected that the smoothness of the coating surface is improved, whereby the alignment degree is improved, or that cissing and unevenness are suppressed, whereby in-plane uniformity is improved.

As the interface improver, a material making the liquid crystal compound horizontal on the coating surface side is preferable, and the compounds (horizontal alignment agents) described in paragraphs [0253] to [0293] of JP2011-237513A can be used. The fluorine (meth)acrylate-based polymers described in paragraphs [0018] to [0043] of JP2007-272185A and the like can also be used. Other compounds may also be used as the interface improver.

In a case where the liquid crystal composition according to the embodiment of the present invention contains an interface improver, the content of the interface improver is preferably 0.01 to 5 parts by mass and more preferably 0.01 to 3 parts by mass with respect to a total of 100 parts by mass of the dichroic substance and the high-molecular weight liquid crystal compound in the liquid crystal composition.

[Method for Producing High-Molecular Weight Liquid Crystal Compound]

The method for producing a high-molecular weight liquid crystal compound according to the embodiment of the present invention includes a step of copolymerizing a monofunctional monomer and a polyfunctional monomer to obtain a high-molecular weight liquid crystal compound, in which a content of the monofunctional monomer is 90% by mass or more with respect to the content of all monomers that are used for polymerizing the high-molecular weight liquid crystal compound, and a content of the polyfunctional monomer is 10% by mass or more with respect to the content of all the monomers that are used for polymerizing the high-molecular weight liquid crystal compound.

It is presumed that the high-molecular weight liquid crystal compound obtained by the present production method contains a small amount of a high-molecular weight body, similarly to the high-molecular weight liquid crystal compound contained in the liquid crystal composition according to the embodiment of the present invention described above. As a result, in a case where a liquid crystal composition containing the high-molecular weight liquid crystal compound obtained by this production method is used, it is possible to form a light absorption anisotropic film which is excellent in plane shape uniformity and has a high alignment degree.

The high-molecular weight liquid crystal compound contained in the liquid crystal composition according to the embodiment of the present invention described above can be produced, for example, by the present production method.

[Monofunctional Monomer]

In the present invention, the monofunctional monomer means a monomer containing only one polymerizable group.

The monofunctional monomer preferably contains a mesogenic group, more preferably contains a mesogenic group containing three or more cyclic structures, and is particularly preferably a compound represented by Formula (1a) from the viewpoint of further improving the alignment degree of the light absorption anisotropic film. Since the specific example of the cyclic structure and the definition of the mesogenic group are as described in M1 of Formula (1), the description thereof will be omitted.

$$P1a\text{-}L1\text{-}SP1\text{-}M1\text{-}T1a \quad (1a)$$

in Formula (1a), P1a represents a polymerizable, L1 represents a single bond or a divalent linking group, SP1 represents a spacer group, M1 represents a mesogenic group having three or more cyclic structures, and T1 represents a terminal group.

Examples of the polymerizable group represented by P1a include groups represented by Formulae (P1a-A) to (P1a-D), and among them, a group represented by Formula (P1a-A) is preferable.

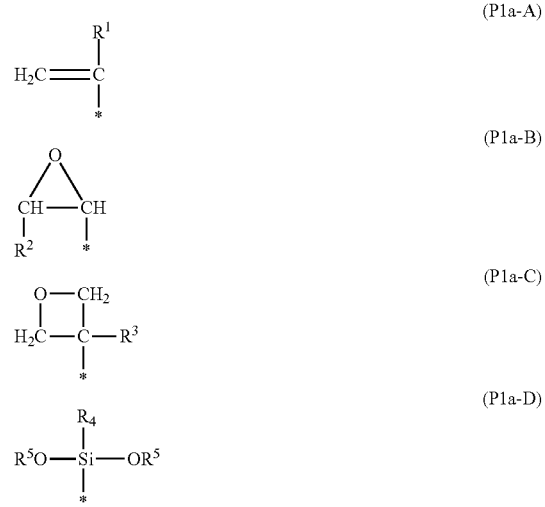

In Formulae (P1a-A) to (P1a-D), "*" represents a bonding position to L1 in Formula (1a).

In formula (P1a-A), $R^1$ represents a hydrogen atom or a methyl group. The group represented by Formula (P1a-A) preferably has a partial structure of a (meth)acrylic acid ester.

The group represented by Formula (P1a-B) is a partial structure of a compound having an epoxy group.

The group represented by Formula (P1a-C) is a partial structure of a compound having an oxetane group.

The group represented by Formula (P1a-D) is a partial structure of a compound having at least one group of an alkoxysilyl group or a silanol group.

$R^1$, $R^2$, $R^3$, and $R^4$ in Formulae (P1a-A) to (P1a-D) are synonymous with $R^1$, $R^2$, $R^3$, and $R^4$ in Formulae (P1-A) to (P1-D), respectively. $R^5$ in Formula (P1a-D) represents a hydrogen atom or an alkyl group having 1 to 10 carbon atoms.

Since specific examples and preferred aspects of L1 in Formula (1a) are the same as those of L1 of Formula (1), the description thereof will be omitted.

Since specific examples and preferred aspects of SP1 in Formula (1a) are the same as those of SP1 of Formula (1), the description thereof will be omitted.

Since specific examples and preferred aspects of M1 in Formula (1a) are the same as those of M1 in Formula (1), the description thereof will be omitted.

The terminal group represented by T1a does not contain a polymerizable group. The specific examples of the polymerizable group are as described above.

Examples of the terminal group represented by T1a include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an acyloxy group having 1 to 10 carbon atoms, an acylamino group having 1 to 10 carbon atoms, an alkoxycarbonyl group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. T1a may be a group formed by combining two or more of the above groups.

T1a is preferably an alkoxy group having 1 to 10 carbon atoms (more preferably an alkoxy group having 1 to 5 carbon atoms, and particularly preferably a methoxy group) or a group obtained by combining an alkoxy group having 1 to 10 carbon atoms and an acyloxy group having 1 to 10 carbon atoms, a terminal of which is substituted with a halogen atom (for example, a group represented by *—O—$R^a$—O—C(O)—$R^b$—X, where $R^a$ and $R^b$ each independently represent an alkylene group having 1 to 10 carbon atoms, X represents a halogen atom, and * represents a bonding position to M1), due to the reason that the effects of the present invention are more excellent.

The content of the monofunctional monomer is 90% by mass or more with respect to the content (100% by mass) of all the monomers that are used in the polymerization of the high-molecular weight liquid crystal compound, and from the viewpoint that the effects of the present invention are more excellent, preferably 95% to 99.999% by mass and more preferably 97% to 99.95% by mass.

The monofunctional monomer may be used alone, or two or more thereof may be used in combination. In a case two or more kinds of monofunctional monomers are used, there is an advantage in that the solubility of the obtained high-molecular weight liquid crystal compound in a solvent is improved and the liquid crystal phase transition temperature is easily adjusted. In a case where two or more kinds of monofunctional monomers are used, it is preferable that the total content thereof is in the range described above.

[Polyfunctional Monomer]

In the present invention, the polyfunctional monomer means a monomer containing two or more polymerizable groups.

The polyfunctional monomer is preferably a compound represented by Formula (2a) from the viewpoint of further improving the alignment degree of the light absorption anisotropic film.

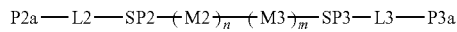
(2a)

In formula (2a). P2a and P3a independently represent polymerizable groups, L2 and L3 independently represent single-bonded or divalent linking groups, and SP2 and SP3 independently represent single-bonded or spacer groups, respectively represented, M2 and M3 independently represent a mesogenic group, and n and m independently represent an integer of 0 or 1, respectively.

Since specific examples and preferred aspects of P2a and P3a in Formula (2a) are the same as those of P1a of Formula (1a), the description thereof will be omitted. P2a and P3a may be the same group or groups different from each other; however, they are preferably the same group from the viewpoint that the alignment degree of the light absorption anisotropic film is further improved.

Since specific examples and preferred aspects of L2 and L3 in Formula (2a) in a case of being a divalent linking group are the same as those of L2 and L3 of Formula (2), the description thereof will be omitted. Both L2 and L3 may be a single bond, the same group, or groups different from each other; however, from the viewpoint that the alignment degree of the light absorption anisotropic film is further improved, both L2 and L3 are preferably a single bond or the same group and more preferably the same group.

Since specific examples and preferred aspects of SP2 and SP3 in Formula (2a) in a case of being a spacer group are the same as those of SP2 and SP3 of Formula (2), the description thereof will be omitted. Both SP2 and SP3 may be a single bond, the same group, or groups different from each other; however, from the viewpoint that the alignment degree of the light absorption anisotropic film is further improved, both SP2 and SP3 are preferably a single bond or the same group and more preferably the same group.

Specific examples and suitable aspects (for example, the partial structure represented by -(M2)$_n$-(M3)$_m$- preferably includes two or more cyclic structures) of M2 and M3 in Formula (2a) are the same as M2 and M3 of Formula (2), the description thereof will be omitted.

Since specific examples of n and m in Formula (2a) and suitable aspects (for example, the sum of n and m is preferably 1 or 2) are the same as n and m in Formula (2), the description thereof will be omitted. n and m may be the same or different from each other; however, they are preferably 1 from the viewpoint of further improving the alignment degree of the light absorption anisotropic film.

Here, since the definition of the same group in Formula (2a) is the same as that in Formula (2), the description thereof will be omitted.

Particularly, P2a and P3a are the same group, both L2 and L3 are a single bond or the same group, both SP2 and SP3 are a single bond or the same group, and both M2 and M3 are the same group. This further improves the alignment degree of a light absorption anisotropic film.

The content of the polyfunctional monomer is 10% by mass or less with respect to the content (100% by mass) of all the monomers that are used in the polymerization of the high-molecular weight liquid crystal compound, and from the viewpoint that the effects of the present invention are more excellent, preferably 0.001% to 5% by mass and more preferably 0.05% to 3% by mass.

The polyfunctional monomer may be used alone, or two or more thereof may be used in combination. In a case where two or more kinds of polyfunctional monomers are used, it is preferable that the total content thereof is in the range described above.

[Step]

The polymerization method for copolymerizing a monofunctional monomer and a polyfunctional monomer is not particularly limited and may be appropriately selected from known polymerization methods depending on the kind of the monomer; however, radical polymerization is preferable.

In the polymerization, in addition to the above-described monomers, a solvent (for example, water and/or an organic solvent), a polymerization initiator, a chain transfer agent, a chelating agent, a pH adjusting agent, and the like may be used.

In a case where a monofunctional monomer and a polyfunctional monomer are polymerized, a high-molecular weight liquid crystal compound having a repeating unit based on the monofunctional monomer and a repeating unit based on the polyfunctional monomer can be obtained. It is presumed that the obtained high-molecular weight liquid crystal compound has a three-dimensionally crosslinked structure in which the moieties corresponding to P2a and P3a of the polyfunctional monomer become crosslinking points.

Here, after the above-described copolymerization, the repeating unit (preferably, the side chain of the repeating unit) based on the monofunctional monomer may be subjected to a treatment for introducing a polymerizable group. Specific examples of the polymerizable group include the polymerizable group in T1 of Formula (1).

Examples of another aspect of the method for producing a high-molecular weight liquid crystal compound include a method in which a monofunctional monomer is polymerized alone to obtain the repeating unit (1), and then the repeating unit (1) and the repeating unit (2) are copolymerized using a polyfunctional monomer.

[Light Absorption Anisotropic Film]

The light absorption anisotropic film according to the embodiment of the present invention is a light absorption anisotropic film that is formed from the above-described liquid crystal composition according to the embodiment of the present invention.

Examples of the method of manufacturing the light absorption anisotropic film according to the embodiment of the present invention include a method including, in order, a step of forming a coating film by applying the liquid crystal composition to a base material (hereinafter, also referred to as "coating film forming step") and a step of aligning a dichroic substance contained in the coating film (hereinafter, also referred to as "alignment step").

Hereinafter, each of the steps of the method of manufacturing the light absorption anisotropic film according to the embodiment of the present invention will be described.

[Coating Film Forming Step]

The coating film forming step is a step of forming a coating film by coating a base material with the liquid crystal composition.

In a case where a liquid crystal composition containing the above-described solvent is used, or a liquid material such as a molten liquid obtained by heating the liquid crystal composition is used, a base material is easily coated with the liquid crystal composition.

Examples of the method of applying the liquid crystal composition include known methods such as a roll coating method, a gravure printing method, a spin coating method, a wire bar coating method, an extrusion coating method, a direct gravure coating method, a reverse gravure coating method, a die coating method, a spray method, and an ink jet method.

In the present aspect, an example in which a base material is coated with the liquid crystal composition has been described; however, the examples are not limited thereto. For example, an alignment film provided on the base material may be coated with the liquid crystal composition. Details of the base material and the alignment film will be described later.

[Alignment Step]

The alignment step is a step of aligning a dichroic substance contained in the coating film. Through this step, a light absorption anisotropic film is obtained.

The alignment step may include a drying treatment. In a case where drying treatment is carried out, a component such as a solvent can be removed from the coating film. The drying treatment may be carried out by a method of leaving the coating film for a predetermined time at room temperature (for example, natural drying) or by a method of carrying out heating and/or air blowing.

Here, the dichroic substance contained in the liquid crystal composition tends to be aligned by the above-described coating film forming step or drying treatment. For example, in an aspect in which the liquid crystal composition is prepared as a coating liquid containing a solvent, the coating film is dried to remove the solvent from the coating film, whereby a coating film (that is, light absorption anisotropic film) having light absorption anisotropy is obtained.

The alignment step preferably has a heating treatment. Accordingly, the dichroic substance contained in the coating film can be aligned, and thus the coating film after the heating treatment can be preferably used as a light absorption anisotropic film.

The heating treatment is preferably carried out at 10° C. to 250° C. and more preferably at 25° C. to 190° C. in terms of manufacturing suitability or the like. The heating time is preferably 1 to 300 seconds and more preferably 1 to 60 seconds.

The alignment step may have a cooling treatment that is carried out after the heating treatment. The cooling treatment is a treatment for cooling the coating film after the heating to about 20° C. to 25° C. of room temperature. Accordingly, the alignment of the dichroic substance contained in the coating film can be fixed. The cooling means is not particularly limited, and the cooling can be carried out by a conventionally known method.

By the above steps, a light absorption anisotropic film can be obtained.

In the present aspect, examples of the method of aligning the dichroic substance contained in the coating film include the drying treatment and the heating treatment; however, the examples are not limited thereto, and a conventionally known alignment treatment can be used.

[Other Steps]

The method of manufacturing a light absorption anisotropic film may have a step of curing the light absorption anisotropic film (hereinafter, also referred to as a "curing step") after the alignment step.

For example, the curing step is carried out by heating and/or light irradiation (exposure). Among the above, light irradiation is preferably carried out to carrying out the curing step.

As the light source that is used for curing, various light sources such as infrared rays, visible light, and ultraviolet rays can be used, and ultraviolet rays are preferable. At the time of curing, ultraviolet rays may be applied while heating or may be applied through a filter that transmits only a specific wavelength.

In addition, the exposure may be carried out under a nitrogen atmosphere. In a case where the light absorption anisotropic film is cured by radical polymerization, the inhibition of polymerization by oxygen is reduced, and thus the exposure is preferably carried out under a nitrogen atmosphere.

The film thickness of the light absorption anisotropic film is preferably 0.1 to 5.0 µm, and more preferably 0.3 to 1.5 µm. Although the film thickness depends on the concentration of the dichroic substance in the liquid crystal composition, a light absorption anisotropic film having an excellent absorbance is obtained in a case where the film thickness is 0.1 µm or more, and a light absorption anisotropic film having an excellent transmittance is obtained in a case where the film thickness is 5.0 µm or less.

[Laminate]

A laminate according to the embodiment of the present invention has a base material and the light absorption anisotropic film according to the embodiment of the present invention formed on the base material.

The laminate according to the embodiment of the present invention may further have a λ/4 plate formed on the light absorption anisotropic film.

In addition, the laminate according to the embodiment of the present invention may have an alignment film between the base material and the light absorption anisotropic film.

The laminate according to the embodiment of the present invention may further have a barrier layer between the light absorption anisotropic film and the λ/4 plate.

Hereinafter, the constituent layers of the laminate according to the embodiment of the present invention will be described.

[Base Material]

The base material can be selected depending on the usage of the light absorption anisotropic film, and examples thereof include glass and a polymer film. The light transmittance of the base material is preferably 80% or more.

In a case where a polymer film is used as the base material, an optically isotropic polymer film is preferably used. As specific examples and preferred aspects of the polymer, those described in paragraph [0013] of JP2002-022942A can be applied. In addition, even a conventionally known polymer such as polycarbonate or polysulfone in which birefringence is easily developed can also be used by reducing the developability through molecular modification described in WO2000/026705A.

[Light Absorption Anisotropic Film]

Since the light absorption anisotropic film is as described above, the description thereof will be omitted.

[λ/4 Plate]

The "λ/4 plate" is a plate having a λ/4 function, and is specifically, a plate having a function of converting linearly polarized light with a specific wavelength into circularly polarized light (or converting circularly polarized light into linearly polarized light).

For example, in an aspect in which the λ/4 plate has a single layer structure, specific examples of the plate include a retardation film in which an optically anisotropic layer having a λ/4 function is provided on a stretched polymer film or a support. In another aspect in which the λ/4 plate has a multilayered structure, specific examples of the plate include a broadband λ/4 plate obtained by laminating a λ/4 plate and a λ/2 plate.

The λ/4 plate and the light absorption anisotropic film may be provided to be in contact with each other, or another layer may be provided between the λ/4 plate and the light absorption anisotropic film. Examples of the layer include a pressure-sensitive adhesive layer or an adhesive layer for securing adhesiveness, and a barrier layer.

[Barrier Layer]

In a case where the laminate according to the embodiment of the present invention has a barrier layer, the barrier layer is provided between the light absorption anisotropic film and the λ/4 plate. In a case where a layer other than the barrier layer (for example, a pressure-sensitive adhesive layer or an adhesive layer) is provided between the light absorption anisotropic film and the λ/4 plate, the barrier layer can be provided between, for example, the light absorption anisotropic film and the above layer other than the barrier layer.

The barrier layer is also called a gas barrier layer (an oxygen barrier layer) and has the function of protecting a light absorption anisotropic film from a gas such as oxygen in the atmosphere, moisture, or a compound contained in the adjacent layer.

Regarding the barrier layer, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A can be referred to.

[Alignment Film]

The laminate according to the embodiment of the present invention may have an alignment film between the base material and the light absorption anisotropic film.

As the alignment film, any layer may be used as long as it allows the dichroic substance contained in the liquid crystal composition according to the embodiment of the present invention to have a desired alignment state on the alignment film.

The alignment film can be provided by means of a rubbing treatment on the film surface with an organic compound (preferably a polymer), oblique vapor deposition of an inorganic compound, forming a layer having microgrooves, or accumulation of an organic compound (for example, ω-tricosanoic acid, dioctadecylmethylammonium chloride or methyl stearate) by the Langmure-Blogette method (LB film). Furthermore, there has been also known an alignment film having an aligning function that is imparted by applying an electrical field, applying a magnetic field, or by irradiation with light. In the present invention, among the above, an alignment film formed by a rubbing treatment is preferable in terms of easy control of a pretilt angle of the alignment film, and an optical alignment film formed by irradiation with light is also preferable in terms of alignment uniformity.

<Rubbing Treated Alignment Film>

The polymer material used for an alignment film formed by a rubbing treatment is described in many documents, and many commercially available products are available. In the present invention, polyvinyl alcohol or polyimide, or a derivative thereof can be preferably used. Regarding the alignment film, the description in the 24th line on page 43 to the 8th line on page 49 in WO2001/088574A1 can be referred to. The thickness of the alignment film is preferably 0.01 to 10 µm and more preferably 0.01 to 1 µm.

<Optical Alignment Film>

The optical alignment material used for an alignment film formed by irradiation with light is described in many documents. In the present invention, preferred examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadimide compounds having photo-alignable units described in JP2002-265541A and JP2002-317013A, photo-crosslinkable silane derivatives described in JP4205195B and JP4205198B, and photo-crosslinkable polyimides, polyamides, and esters described in JP2003-520878A, JP2004-529220A, and JP4162850B. Azo compounds, photo-crosslinkable polyimides, polyamides, or esters are more preferable.

To an optical alignment film formed from the above-described material, linearly polarized light or non-polarized light is applied to manufacture an optical alignment film.

In this specification, the "linearly polarized light irradiation" and the "non-polarized light irradiation" are operations for causing a photoreaction to the optical alignment material. The wavelength of the light used varies depending on the optical alignment material used and is not particularly limited as long as the wavelength is a wavelength necessary for the photoreaction. The peak wavelength of the light used for light irradiation is preferably 200 nm to 700 nm, and ultraviolet light having a light peak wavelength of 400 nm or less is more preferable.

The light source used for light irradiation is a usually used light source, and examples thereof include lamps such as a tungsten lamp, a halogen lamp, a xenon lamp, a xenon flash lamp, a mercury lamp, a mercury/xenon lamp, and a carbon arc lamp, various lasers [for example, a semiconductor laser, a helium/neon laser, an argon ion laser, a helium/cadmium laser, and a YAG (yttrium/aluminum/garnet) laser], light emitting diodes, and cathode ray tubes.

As means for obtaining linearly polarized light, a method using a polarizing plate (for example, an iodine polarizing plate, a dichroic dye polarizing plate, or a wire grid polarizing plate), a method using a prism-based element (for example, a GLAN-THOMSON prism) or a reflective polarizer using a BREWSTER angle, or a method using light emitted from a polarized laser light source can be employed. Only light having a necessary wavelength may be selectively applied by using a filter, a wavelength conversion element, or the like.

In a case where linearly polarized light is used as light for irradiation, a method of irradiating the alignment film with light from an upper surface or a rear surface in a direction vertical or diagonal from the alignment film surface is employed. Although the incidence angle of the light varies depending on the optical alignment material, the incidence angle is preferably 0° to 90° (vertical) and more preferably 40° to 90°.

In a case where non-polarized light is used, the alignment film is irradiated with non-polarized light from a diagonal direction. The incidence angle of the light is preferably 10° to 80°, more preferably 20° to 60°, and still more preferably 30° to 50°.

The irradiation time is preferably 1 minute to 60 minutes and more preferably 1 minute to 10 minutes.

In a case where patterning is required, a method of carrying out light irradiation using a photomask as many times as necessary for pattern formation, or a pattern writing method using laser beam scanning can be employed.

[Usage]

The laminate according to the embodiment of the invention can be used as a polarizing element (a polarizing plate). For example, it can be used as a linearly polarizing plate or a circularly polarizing plate.

In a case where the laminate according to the embodiment of the invention has no optically anisotropic layer such as the λ/4 plate, the laminate can be used as a linearly polarizing plate.

In a case where the laminate according to the embodiment of the invention has the λ/4 plate, the laminate can be used as a circularly polarizing plate.

[Image Display Device]

An image display device according to the embodiment of the present invention has the above-described light absorption anisotropic film or the above-described laminate.

The display element used for the image display device according to the embodiment of the invention is not particularly limited, and examples thereof include a liquid crystal cell, an organic electroluminescence (hereinafter, abbreviated as "EL"), a display panel, and a plasma display panel.

Among these, a liquid crystal cell or an organic EL display panel is preferable, and a liquid crystal cell is more preferable. That is, as the image display device according to the embodiment of the invention, a liquid crystal display device using a liquid crystal cell as a display element, or an organic EL display device using an organic EL display panel as a display element is preferable, and a liquid crystal display device is more preferable.

[Liquid Crystal Display Device]

Preferred examples of the liquid crystal display device as one example of the image display device according to the embodiment of the invention include an aspect in which the above-described light absorption anisotropic film and a liquid crystal cell are included. More preferably, the liquid crystal display device has the above-described laminate (but including no λ/4 plate) and a liquid crystal cell.

In the present invention, it is preferable that the light absorption anisotropic film (laminate) according to the embodiment of the invention is used as a polarizing element on the front side among light absorption anisotropic film s (laminates) that is provided on both sides of a liquid crystal cell, and it is more preferable that the light absorption anisotropic film (the laminate) according to the embodiment of the invention is used as polarizing elements on the front side and the rear side.

Hereinafter, the liquid crystal cell of the liquid crystal display device will be described in detail.

<Liquid Crystal Cell>

The liquid crystal cell used for the liquid crystal display device is preferably a vertical alignment (VA) mode, an optically compensated bend (OCB) mode, an in-plane-switching (IPS) mode, or a twisted nematic (TN) mode; however, the liquid crystal cell is not limited thereto.

In a TN mode liquid crystal cell, without application of a voltage, rod-like liquid crystalline molecules are substantially horizontally aligned, and twist-aligned by 600 to 120°. The TN mode liquid crystal cell is most frequently used as a color thin film transistor (TFT) liquid crystal display device and is described in many documents.

In a VA mode liquid crystal cell, rod-like liquid crystalline molecules are substantially vertically aligned without application of a voltage. The VA mode liquid crystal cell includes (1) a narrowly-defined VA mode liquid crystal cell in which rod-like liquid crystalline molecules are substantially vertically aligned without application of a voltage, and are substantially horizontally aligned with the application of a voltage (described in JP1990-176625A (JP-H2-176625A)), (2) an MVA mode liquid crystal cell in which the VA mode is made into multi-domains in order to expand the viewing angle (described in SID97, Digest of tech. Papers (proceedings) 28 (1997) 845), (3) an n-ASM mode liquid crystal cell in which rod-like liquid crystalline molecules are substantially vertically aligned without application of a voltage, and are twisted and aligned in multi-domains with the application of a voltage (described in the proceedings 58 and 59 of Japanese Liquid Crystal Conference (1998)), and (4) a SURVIVAL mode liquid crystal cell (announced at LCD International 98). In addition, the VA mode liquid crystal cell may be any one of a patterned vertical alignment (PVA) type, an optical alignment type, or a polymer-sustained alignment (PSA) type. Details of these modes are described in JP2006-215326A and JP2008-538819A.

In an IPS mode liquid crystal cell, rod-like liquid crystalline molecules are substantially horizontally aligned with respect to a substrate, and the liquid crystalline molecules respond in a planar manner with the application of an electric field parallel to a substrate surface. The IPS mode displays a black image in a state in which no electric field is applied thereto, and the absorption axes of a pair of upper and lower polarizing plates are perpendicular to each other. Methods of improving the viewing angle by reducing light leakage caused when a black image is displayed in a diagonal direction using an optical compensation sheet is disclosed by JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), JP1998-307291A (JP-H10-307291A), and the like.

[Organic EL Display Device]

An organic EL display device as an example of the image display device according to the embodiment of the present invention preferably has an aspect in which it has a light absorption anisotropic film, a λ/4 plate, and an organic EL display panel in this order from the visual recognition side.

More preferably, the organic EL display device has the above-described laminate having a λ/4 plate and an organic EL display panel in this order from the visual recognition side. In this case, the laminate has a base material, an alignment film to be provided as necessary, a light absorption anisotropic film, a barrier layer to be provided as necessary, and a λ/4 plate disposed in this order from the visual recognition side.

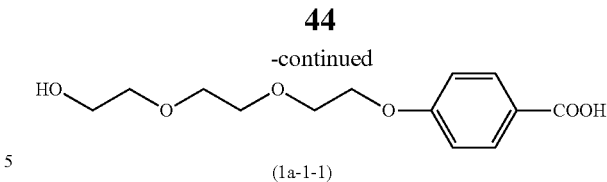

(1a-1-1)

Butylparaben (300 g) and potassium carbonate (299 g) were added to normal butanol (nBuOH) solution (480 mL) of 2-chloroethoxyethoxyethanol (365 g). After stirring at 100° C. for 18 hours, water (1,050 mL) was added, and the reaction solution was washed by a liquid separation operation. A 22% by mass aqueous sodium hydroxide solution (420 g) was added to the obtained organic layer, and the mixture was stirred at 50° C. for 3 hours. Then, the temperature of the mixture was returned to room temperature, concentrated hydrochloric acid was added dropwise until the pH reached 3, and the reaction solution was washed by a liquid separation operation. The obtained organic layer was added dropwise to a mixed solution of isopropyl alcohol (540 mL) and normal hexane (1,260 mL), which was cooled in advance to 10° C. or lower, and a filtration operation was carried out to obtain 361 g of a compound (1a-1-1) which was a white solid (two-step yield: 87%).

$^1$H nuclear magnetic resonance (NMR) (solvent: dimethyl sulfoxide (DMSO)-d6) δ (ppm): 3.38 to 3.64 (m, 8H), 3.73 to 3.79 (m, 2H), 4.13 to 4.19 (m, 2H), 4.58 (br s, 1H), 6.98 to 7.05 (m, 2H), 7.85 to 7.90 (m, 2H), 12.63 (br s, 1H)

[Synthesis of Compound (1a-1-2)]

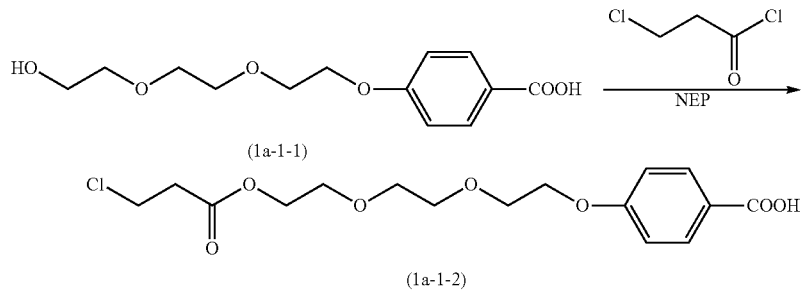

In addition, the organic EL display panel is a display panel having a configuration using an organic EL element in which an organic light emitting layer (organic electroluminescence layer) is interposed between electrodes (between a cathode and an anode). The configuration of the organic EL display panel is not particularly limited, and a conventionally known configuration is employed.

EXAMPLES

Hereinafter, the present invention will be described in more detail based on Examples. Materials, used amounts, ratios, treatment contents, treatment procedures, and the like shown in the following examples are able to be properly changed without departing from the gist of the invention. Therefore, the scope of the present invention should not be restrictively interpreted by the following Examples.

[Synthesis of Monofunctional Monomer (1a-1)]
[Synthesis of Compound (1a-1-1)]

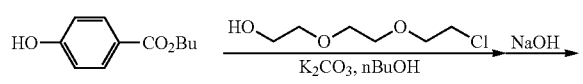

300 g of the compound (1a-1-1) was dissolved in N-ethylpyrrolidone (NEP) (450 mL) and ethyl acetate (800 mL), and the internal temperature was cooled to 5° C. 3-chloropropionic acid chloride (169 g) was added dropwise thereto so that the internal temperature did not rise to 15° C. or higher. After stirring at 10° C. for 3 hours, 10% by mass saline solution (1,200 mL) was added, and the liquid separation was carried out at room temperature. 10% by mass saline solution (1,200 mL) was added again to the obtained organic layer, and the liquid separation was carried out. Then, methanol (750 mL) and water (750 mL) were added dropwise to the organic layer with stirring, the mixture was cooled to 15° C., and then water (300 mL) was added dropwise again. Next, the filtration operation was carried out to obtain 332 g of a compound (1a-1-2) which was a white solid (yield: 83%).

$^1$H-NMR (solvent: CDCl$_3$) δ (ppm): 2.82 (t, 2H), 3.65 to 3.83 (m, 8H), 3.85 to 3.95 (m, 2H), 4.15 to 4.25 (m, 2H), 4.25 to 4.35 (m, 2H), 6.93 to 7.00 (m, 2H), 8.02 to 8.08 (m, 2H)

[Synthesis of Compound (1a-1-3)]

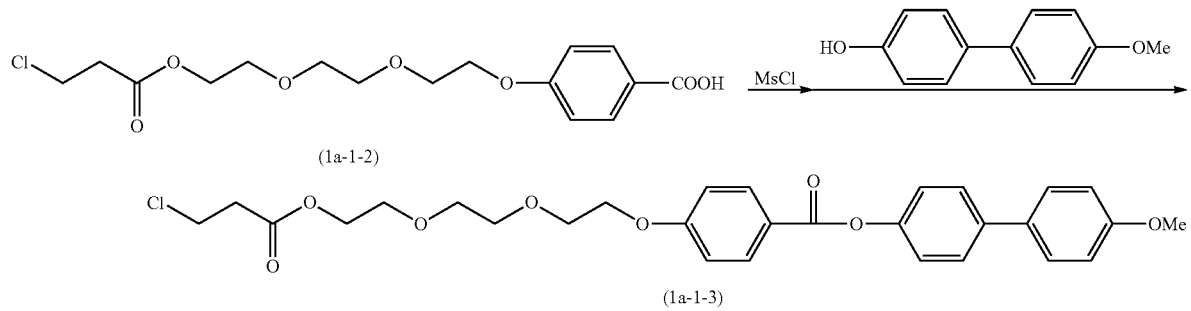

An ethyl acetate solution (253 mL) of methanesulfonyl chloride (MsCl) (56 g) was cooled to an internal temperature of 0° C. An ethyl acetate solution (253 mL) of the compound (1a-1-2) (168 g), diisopropylethylamine (DIPEA) (63 g), and dibutyl hydroxytoluene (BHT) (930 mg) was added thereto so that the internal temperature did not rise to 10° C. or higher. After stirring at 5° C. for 1 hour, 4-hydroxy-4'-methoxybiphenyl (85 g, however, containing 0.2% by mass of 4,4'-biphenol) and N-methylimidazole (17 g) were added, and then diisopropylethylamine (55 g) was added dropwise so that the internal temperature did not rise to 10° C. or higher. Then, stirring was carried out for 4 hours at room temperature. An aqueous solution obtained by mixing 34 g of salt and 0.5 N aqueous hydrochloric acid solution (660 mL) was added to the reaction solution to stop the reaction, and a liquid separation operation was carried out. Acetonitrile (168 mL) and methanol (842 mL) were added to the extracted organic layer with stirring, and water (337 mL) was added dropwise. Then, the mixture was cooled to 0° C. and filtered to obtain 219 g of a compound (1a-1-3) which was a white solid (yield: 95%).

In the formula, Me represents a methyl group. The same applies to the following formulae.

$^1$H-NMR (solvent: CDCl$_3$) δ (ppm): 2.83 (t, 2H) 3.65 to 3.80 (m, 8H). 3.86 (s, 3H), 3.87 to 3.95 (m, 2H), 4.18 to 4.26 (m, 2H), 4.27 to 4.35 (m, 2H), 6.95 to 7.05 (m, 4H), 7.22 to 7.28 (m, 2H), 7.48 to 7.62 (m, 4H), 8.14 to 8.18 (m, 2H)

Synthesis of 4-hydroxy-4'-methoxybiphenyl 4-hydroxy-4'-methoxybiphenyl that was used in the synthesis of 1-1-3a was synthesized as follows.

A 7.8% by mass potassium hydroxide solution (651 g) was added to a dimethyl sulfide solution (150 mL) of 4,4'-biphenol (55.8 g) and methyl iodide (18.6 mL) at room temperature, and the mixture was stirred for 8 hours. The reaction solution was filtered through Celite, concentrated hydrochloric acid (24 mL) was added dropwise to the obtained filtrate, and then a filtration operation was carried out to obtain a white solid containing 4,4'-biphenol. The obtained white solid was dissolved in tetrahydrofuran (100 mL), 0.5N aqueous sodium hydroxide solution (80 mL) and methanol (50 mL) were added thereto, and then 1N aqueous hydrochloric acid solution (40 mL) and water (20 mL) were added dropwise to precipitate crystals, followed by filtration to obtain a white solid of 4-hydroxy-4'-methoxybiphenyl (21 g, yield: 35%). It was confirmed by high performance liquid chromatography analysis that 0.2% by mass of 4,4'-biphenol remained in the white solid.

(Synthesis of Monofunctional Monomer (1a-1))

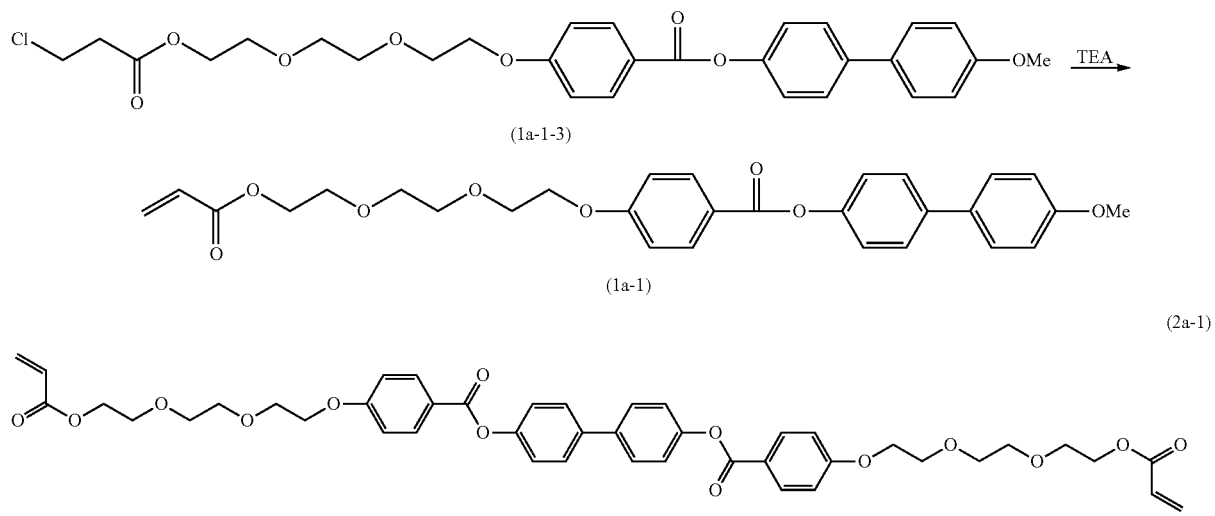

The compound (1a-1-3) (160 g) and dibutyl hydroxytoluene (BHT) (1,300 mg) were dissolved in a mixed solution of ethyl acetate (180 mL), toluene (176 mL), and acetonitrile (208 mL), and then triethylamine (TEA) (60 g) was added dropwise thereto. Thereafter, stirring was carried out at 60° C. for 3 hours. After cooling to room temperature, 1N aqueous hydrochloric acid solution (288 mL) was added to the reaction solution to stop the reaction, and a liquid separation operation was carried out. After filtering the extracted organic layer through a filter, methanol (960 mL) was added dropwise with stirring. Then, the mixture was cooled to 0° C. and filtered to obtain 138 g of a compound (1a-1) (a monofunctional monomer (1a-1)) which was a white solid (yield: 93%). The purity of the compound purity was 98%. It was confirmed by high performance liquid chromatography analysis that 0.3% by mass of a compound (2a-1) (a polyfunctional monomer (2a-1)) remained in the white solid.

$^1$H-NMR (solvent: CDCl$_3$) δ (ppm): 3.68 to 3.80 (m, 6H), 3.85 (s, 3H), 3.87 to 3.94 (m, 2H), 4.18 to 4.26 (m, 2H), 4.32 to 4.38 (m, 2H), 5.83 (dd, 1H), 6.16 (dd, 1H), 6.43 (dd, 1H), 6.95 to 7.05 (m, 4H), 7.22 to 7.28 (m, 2H), 7.48 to 7.62 (m, 4H), 8.13 to 8.20 (m, 2H)

[Synthesis of monofunctional monomer (1a-2)]

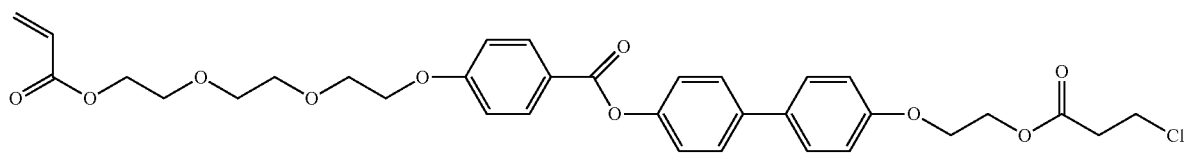

(1a-2)

The monofunctional monomer (1a-2) was synthesized according to the method described in WO 2018/124198.

[Synthesis of Polyfunctional Monomer (2a-1)]

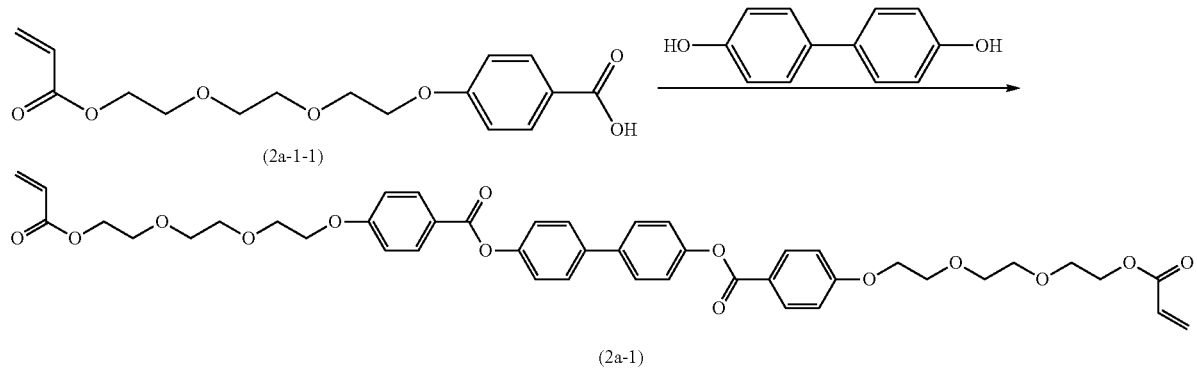

Dibutyl hydroxytoluene (BHT) (200 mg) was added to a tetrahydrofuran (THF) solution (70 mL) of methanesulfonyl chloride (MsCl) (73.4 mmol, 5.7 mL), and the resultant mixture was cooled to an internal temperature of −5° C. The compound (2a-1-1) (synthesized according to the method disclosed in WO2018/124198A) (66.7 mmol, 21.6 g) and a THF solution of diisopropylethylamine (DIPEA) (75.6 mmol, 13.0 mL) were added dropwise thereto so that the internal temperature did not rise to 0° C. or higher. After stirring for 30 minutes at −5° C., N,N-dimethyl-4-aminopyridine (DMAP) (200 mg) was added, and a tetrahydrofuran (THF) and dimethylacetamide (DMAc) solution of diisopropylethylamine (75.6 mmol, 13.0 mL) and 4-4'-biphenyl (30 mmol, 5.59 g) were added dropwise so that the internal temperature did not rise to 0° C. or higher. Then, stirring was carried out for 4 hours at room temperature. The reaction was stopped by adding methanol (5 mL), and then water and ethyl acetate were added. From the organic layer extracted with the ethyl acetate, the solvent was removed by a rotary evaporator, and purification by column chromatography using ethyl acetate and hexane was carried out to obtain 12 g of a compound (2a-1) (a polyfunctional monomer (2a-1)) a white solid.

[Synthesis of Polyfunctional Monomer (2a-2)]

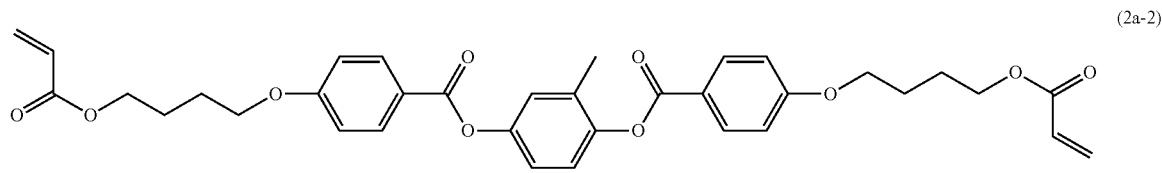 [SMILES: C=CC(=O)OCCCCOc1ccc(C(=O)Oc2ccc(OC(=O)c3ccc(OCCCCOC(=O)C=C)cc3)c(C)c2)cc1]

(2a-2)

The polyfunctional monomer (2a-2) was synthesized according to a known method.

[Polyfunctional Monomer (2a-3)]

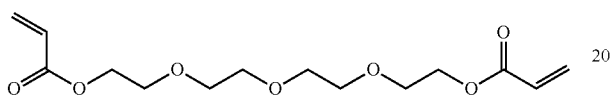

(2a-3)

As the polyfunctional monomer (2a-3), tetraethylene glycol diacrylate manufactured by Tokyo Chemical Industry Co., Ltd. was used.

[Synthesis of Polyfunctional Monomer (2a-4)]

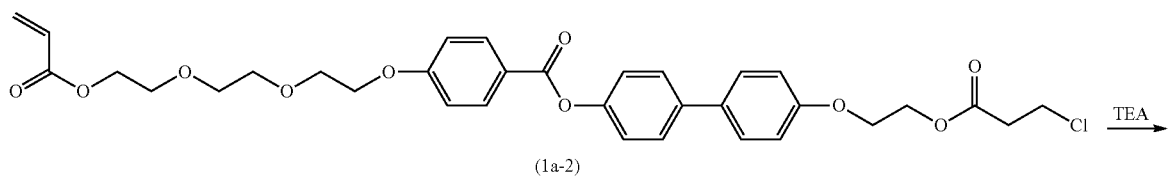

(1a-2) TEA →

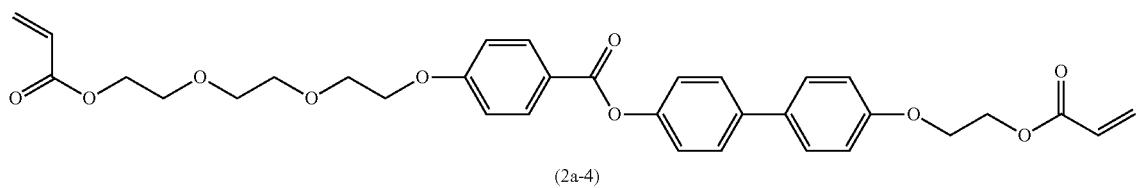

(2a-4)

The compound (1a-2) (the monofunctional monomer (1a-2) (60 g) and dibutyl hydroxytoluene (BHT) (1,300 mg) were dissolved in a mixed solution of ethyl acetate (90 mL), toluene (80 mL), and acetonitrile (104) mL, and then triethylamine (TEA) (30 g) was added dropwise thereto. Thereafter, stirring was carried out at 60° C. for 3 hours. After cooling to room temperature, IN aqueous hydrochloric acid solution (140 mL) was added to the reaction solution to stop the reaction, and a liquid separation operation was carried out. After filtering the extracted organic layer through a filter, methanol (480 mL) was added dropwise with stirring. Then, the mixture was cooled to 0° C. and filtered to obtain 50 g of a compound (2a-4) (a polyfunctional monomer (2a-4)) which was a white solid.

[Production of High-Molecular Weight Liquid Crystal Compound 1-1]

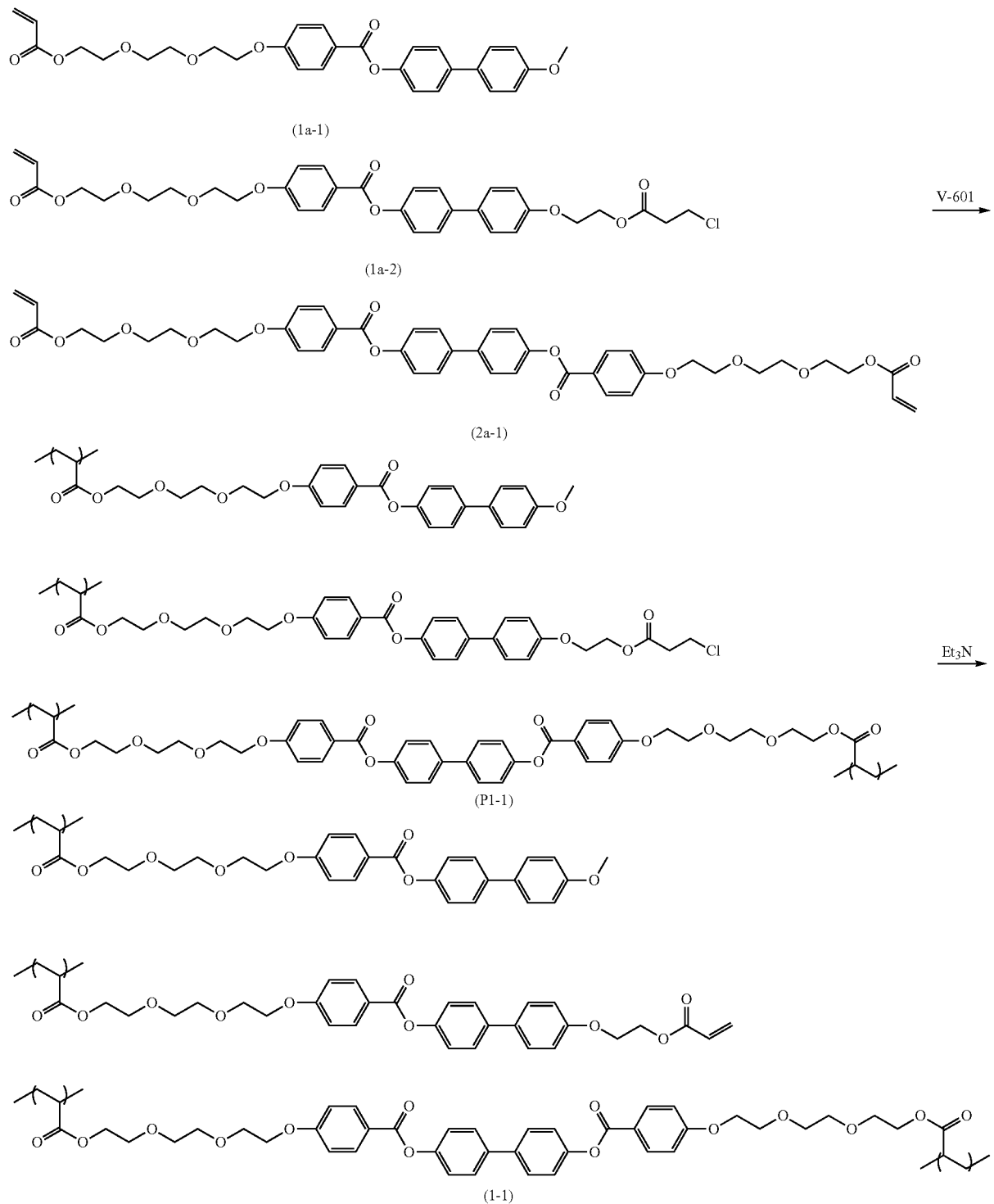

A DMAc solution (3.3 mL) of the monofunctional monomer (1a-1) (0.8 g, however, containing 0.3% by mass of a polyfunctional monomer (2a-1)) and the monofunctional monomer (1a-2) (0.2 g) was heated to an internal temperature of 80° C. under a nitrogen stream. A DMAc solution (0.5 mL) of 2,2'-azobis(2-methylpropionic acid)dimethyl (0.54 mmol, 0.012 g) was added thereto, and stirring was carried out for 2 hours at 80° C. Thereafter, the disappearance of the polymerizable group was confirmed by $^1$H-NMR spectrum measurement, and the solution was cooled to room temperature. Methanol was added and filtration was carried out, and the residue was washed with methanol to obtain 0.90 g of a compound P1-1 as a white solid. Dibutyl hydroxytoluene (BHT) (50 mg) and triethylamine (Et₃N) (0.7 mL) were added to a chloroform solution (7 mL) of the obtained compound P1-1 and heated to an internal temperature of 50° C. under a nitrogen stream. After stirring at 50° C. for 9 hours, the disappearance of the raw material was confirmed by $^1$H-NMR spectrum measurement, and the mixture was cooled to room temperature. Methanol was added thereto and filtration was carried out, and the residue was washed with methanol to obtain 0.8 g of a high-molecular weight liquid crystal compound 1-1 as a white solid. When the obtained high-molecular weight liquid crystal compound L1-1 was analyzed by gel permeation chromatography (GPC), the weight-average molecular weight (Mw) was 17,000 (in terms of polystyrene).

[Production of High-Molecular Weight Liquid Crystal Compounds 1-2 to 1-4]

High-molecular weight liquid crystal compounds 1-2 to 1-4 were synthesized in the same manner as in the production of the high-molecular weight liquid crystal compound 1-1, except that the polyfunctional monomer was added so that the total amount of the polyfunctional monomer (2a-1) that was used for the polymerization was the amount shown in Table 1.

[Production of High-Molecular Weight Liquid Crystal Compound 1-5]

Purification by column chromatography was repeated until the polyfunctional monomer (2a-1) contained in the monofunctional monomer (1a-1) was removed. A high-molecular weight liquid crystal compound 1-5 was synthesized in the same manner as in the production of the high-molecular weight liquid crystal compound 1-1, except that the monofunctional monomer (1a-1), the monofunctional monomer (1a-2), and the polyfunctional monomer (2a-2), which were obtained as described above, were used according to the blending ratios shown in Table 1.

[Production of High-Molecular Weight Liquid Crystal Compound 1-6]

A high-molecular weight liquid crystal compound 1-6 was synthesized in the same manner as in the production of the high-molecular weight liquid crystal compound 1-5, except that a poly-functional monomer (2a-3) was used instead of the polyfunctional monomer (2a-2).

[Production of High-Molecular Weight Liquid Crystal Compound 1-7]

A high-molecular weight liquid crystal compound 1-7 was synthesized in the same manner as in the production of the high-molecular weight liquid crystal compound 1-5, except that a polyfunctional monomer (2a-4) was used instead of the polyfunctional monomer (2a-2).

[Production of High-Molecular Weight Liquid Crystal Compound 1-8]

A high-molecular weight liquid crystal compound 1-8 was synthesized in the same manner as in the production of the high-molecular weight liquid crystal compound 1-5, except that a polyfunctional monomer (2a-2) was not used.

[Production of High-Molecular Weight Liquid Crystal Compound 1-9]

A high-molecular weight liquid crystal compounds 1-9 was synthesized in the same manner as in the production of the high-molecular weight liquid crystal compound 1-1, except that the polyfunctional monomer was added so that the total amount of the polyfunctional monomer (2a-1) that was used for the polymerization was the amount shown in Table 1.

[Production of High-Molecular Weight Liquid Crystal Compound 1-10]

A high-molecular weight liquid crystal compound 1-10 was synthesized in the same manner as in the production of the high-molecular weight liquid crystal compound 1-5, except that a polyfunctional monomer (2a-2) was not used.

The structures of the high-molecular weight liquid crystal compounds 1-1 to 1-10 are shown below.

The numerical value denoted on the right side of the formula number of the high-molecular weight liquid crystal compound represents the mass ratio of the repeating unit. Specifically, in a case where a high-molecular weight liquid crystal compound has three kinds of repeating units, the ratio means the mass of the upper repeating unit:the mass of the middle repeating unit:the mass of the lower repeating unit. In a case where a high-molecular weight liquid crystal compound has two kinds of repeating units, the ratio means the mass of the upper repeating unit:the mass of the lower repeating unit.

(1-1)

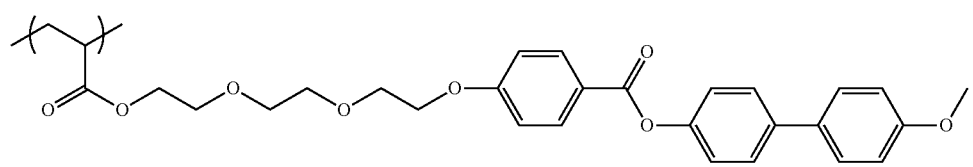

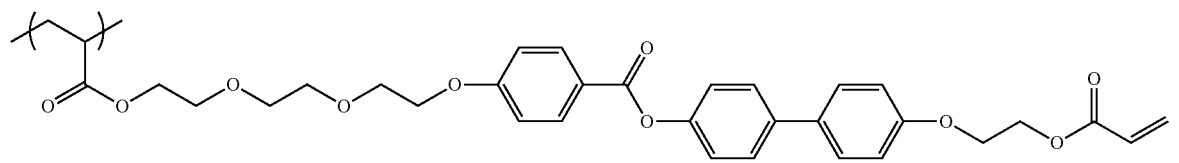

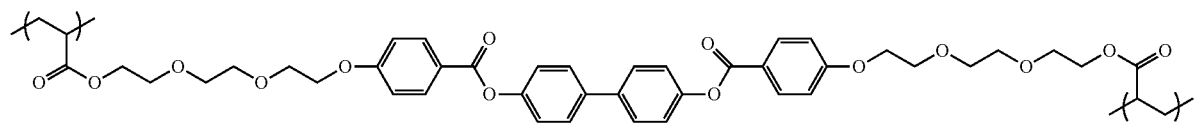

79.76:20:0.24

(1-2)
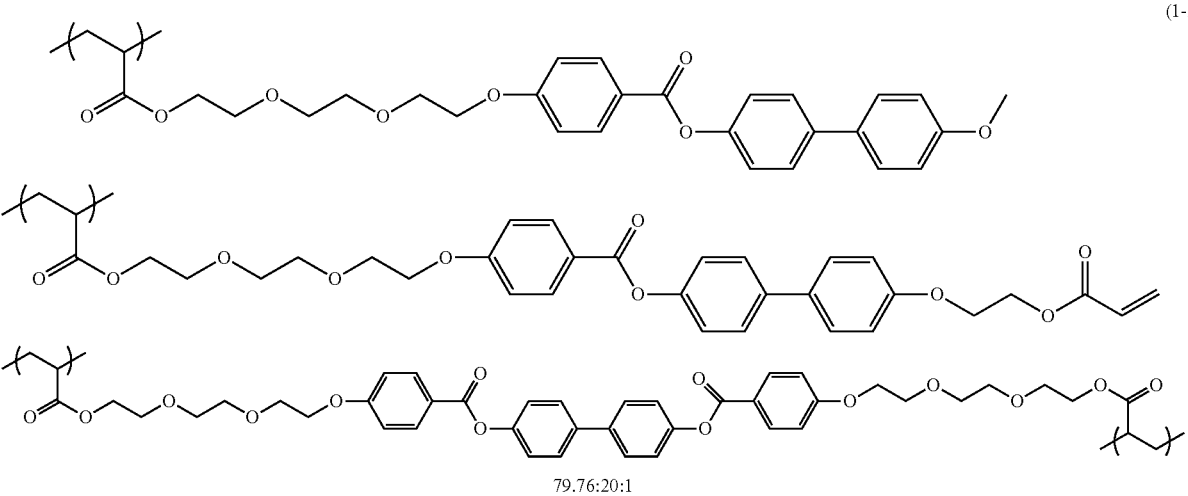
79.76:20:1
(1-3)
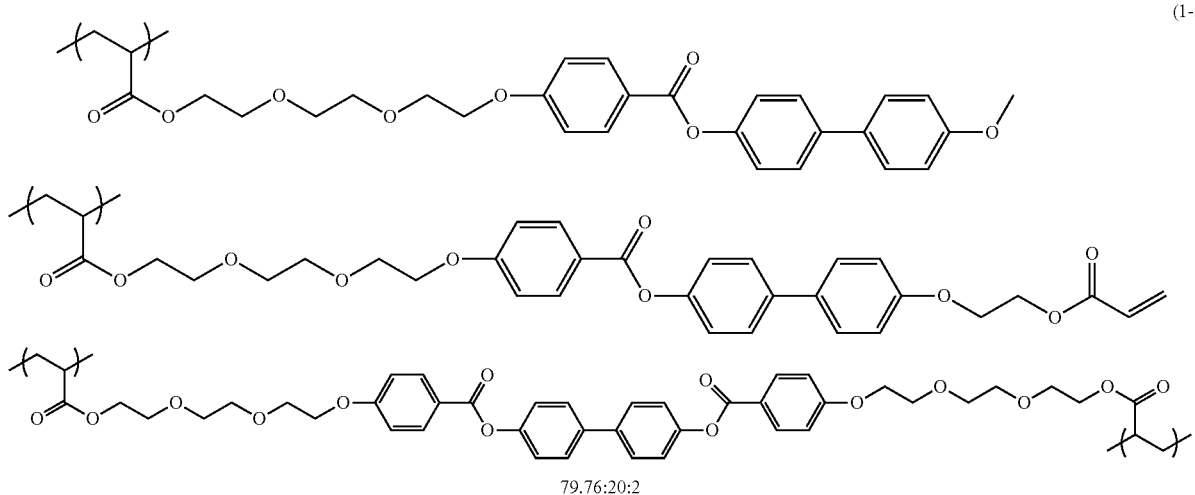
79.76:20:2
(1-4)
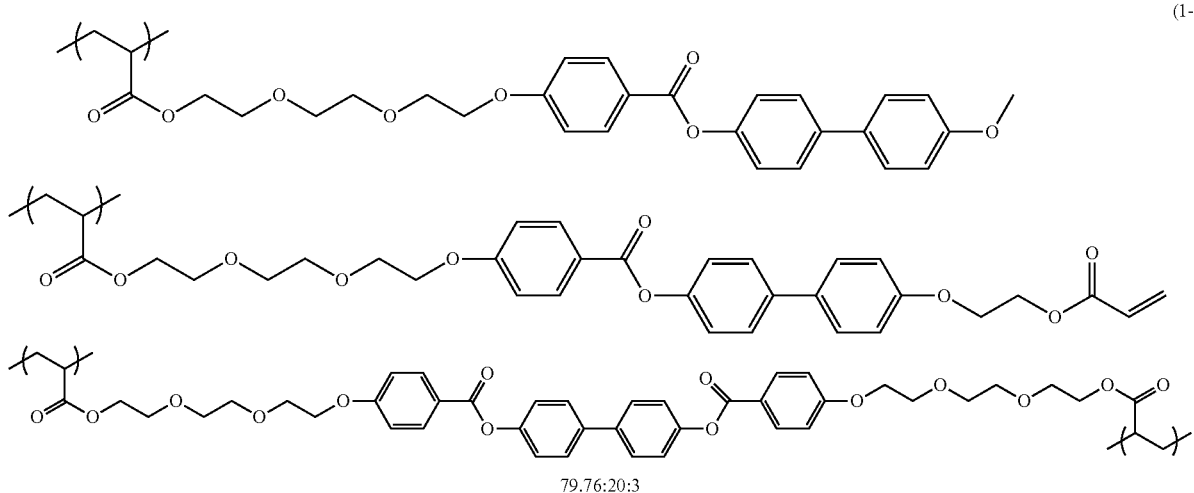
79.76:20:3
(1-5)
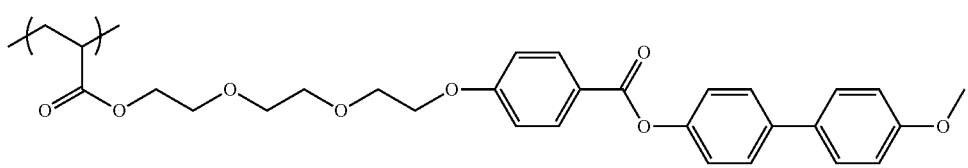

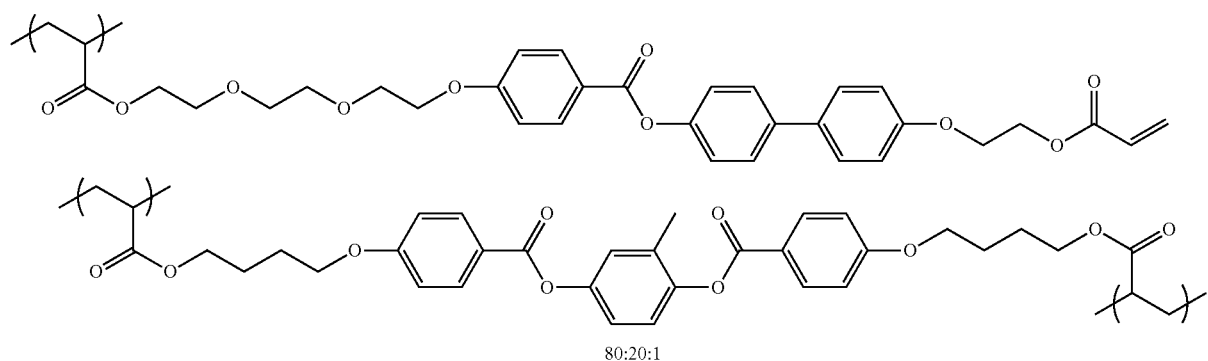
80:20:1
(1-6)
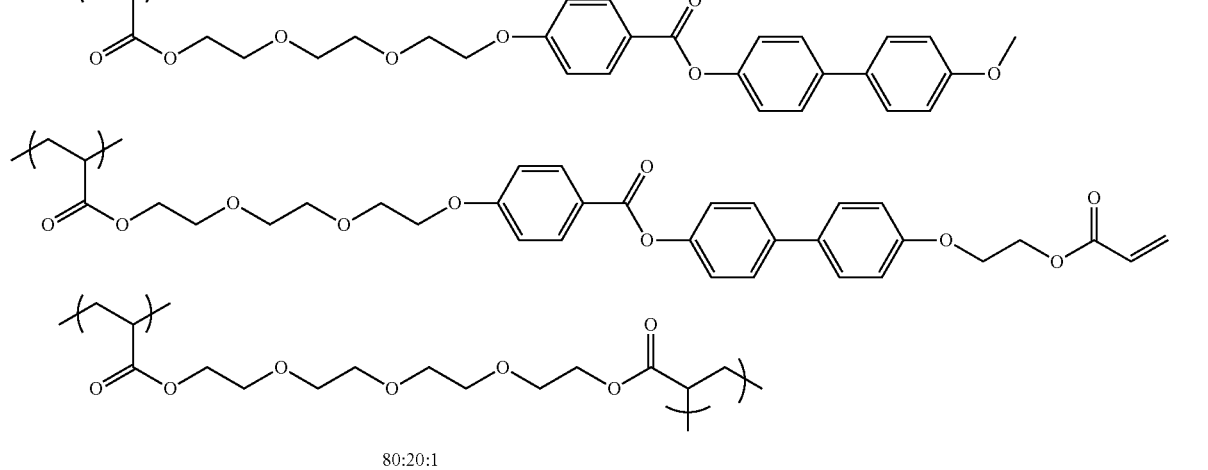
80:20:1
(1-7)
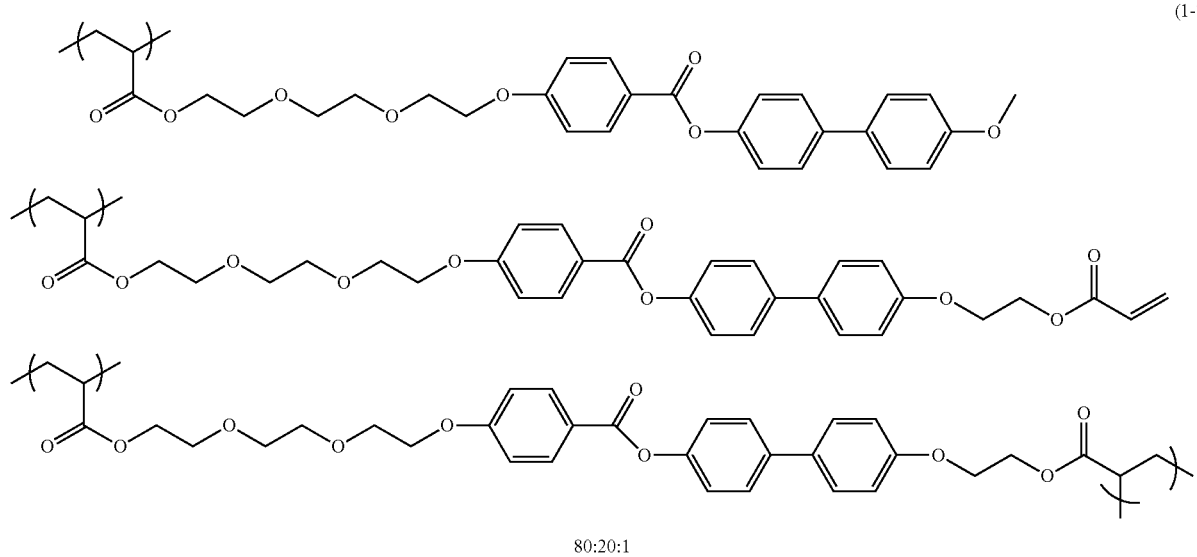
80:20:1
(1-8)
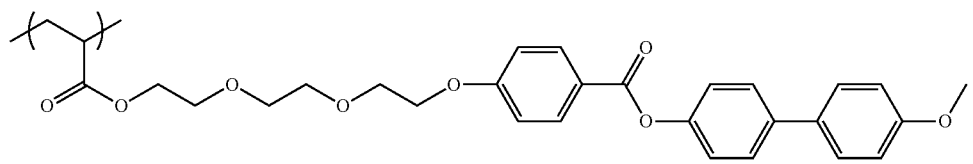

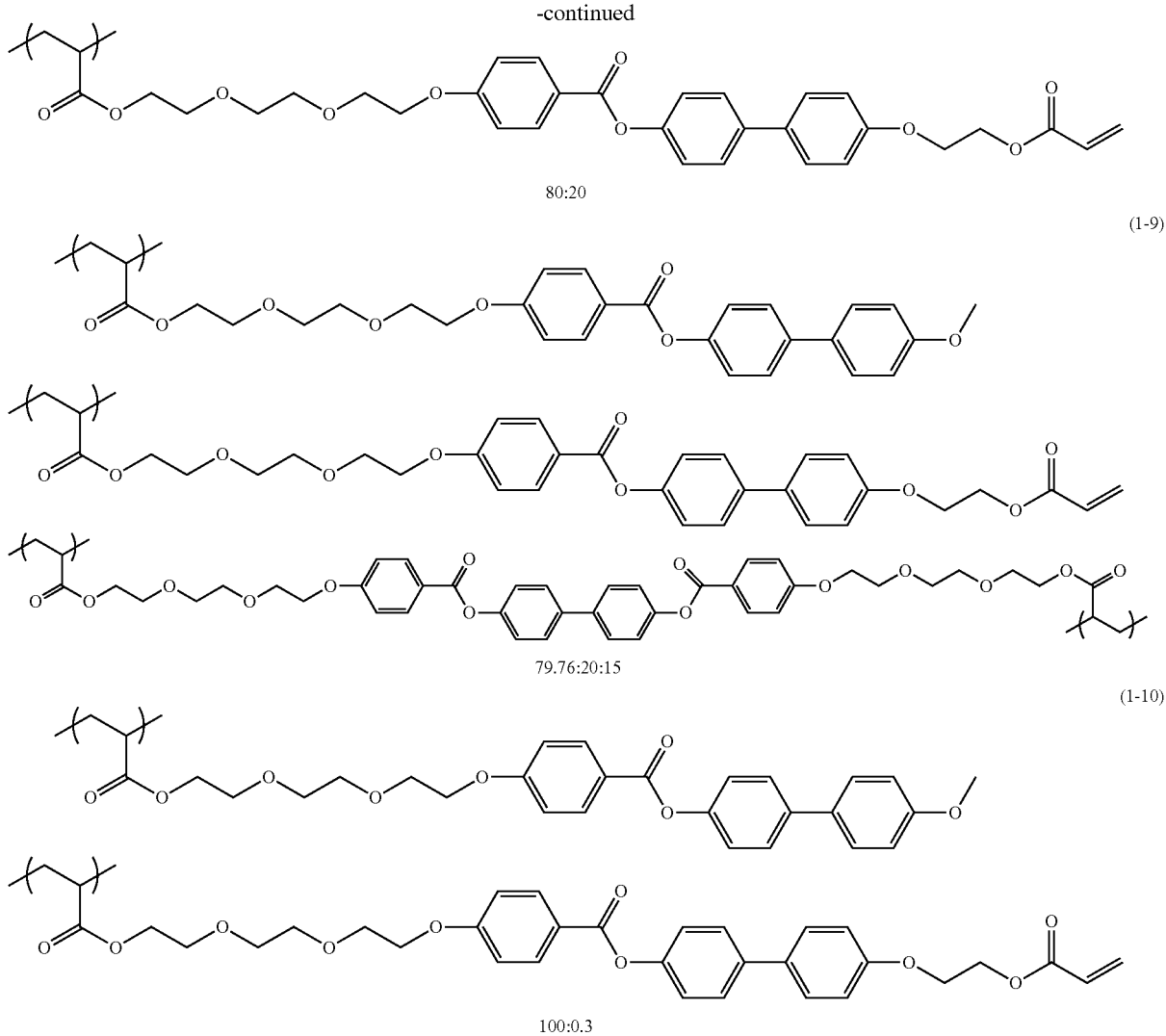

(1-9)

(1-10)

Example 1

[Preparation of Alignment Film]

A glass base material (manufactured by Central Glass Co., Ltd., blue plate glass, size: 300 mm×300 mm, thickness: 1.1 mm) was washed with an alkaline detergent, and then pure water was poured thereto. Thereafter, the glass base material was dried.

The following alignment film forming composition 1 was applied to the glass base material after the drying using a bar #12, and the applied alignment film forming composition 1 was dried for 2 minutes at 110° C. to form a coating film on the glass base material.

The obtained coating film was subjected to a rubbing treatment (rotation speed of roller: 1,000 rotations/2.9 mm of spacer thickness, stage speed: 1.8 m/min) once to produce an alignment film 1 on the glass base material.

| Composition of alignment film forming composition 1 | |
|---|---|
| Modified vinyl alcohol (see Formula (PVA-1)) | 2.00 parts by mass |
| Water | 74.08 parts by mass |
| Methanol | 23.86 parts by mass |
| Photopolymerization Initiator (IRGACURE 2959, manufactured by BASF SE) | 0.06 parts by mass |

-continued

Composition of alignment film forming composition 1

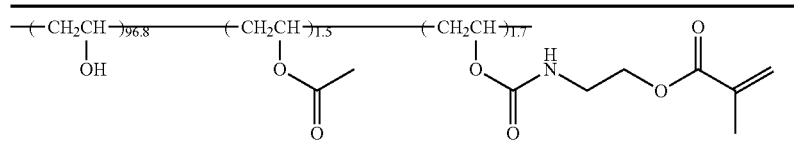

PVA-1

[Preparation of Light Absorption Anisotropic Film]

The obtained alignment film 1 was spin-coated with the following liquid crystal composition 1 by 1,000 rotations to form a coating film.

The coating film was dried at room temperature for 30 seconds and then heated at 180° C. for 15 seconds.

Next, the coating film was cooled to room temperature and then irradiated with light under an irradiation condition of an illuminance of 28 mW/cm$^2$ at 80° C. for 60 seconds using a high-pressure mercury lamp to produce a light absorption anisotropic film 1 on the alignment film 1.

pound in the liquid crystal composition was changed as shown in Table 1.

[Evaluation]

[Alignment Degree]

In a state in which a linear polarizer was inserted on the light source side of an optical microscope (manufactured by Nikon Corporation, product name "ECLIPSE E600 POL"), the light absorption anisotropic film of each of the examples and the comparative examples was set on a sample table, and using a multi-channel spectroscope (manufactured by Ocean

| Composition of liquid crystal composition 1 (content of dichroic substance in solid content: 25% by mass) | |
|---|---|
| High-molecular weight liquid crystal compound 1-1 above | 70 parts by mass |
| Dichroic Substance D1 below | 1.0 parts by mass |
| Dichroic Substance D2 below | 13.2 parts by mass |
| Polymerization Initiator Irg-819 (manufactured by BASF SE) | 0.5 parts by mass |
| Interface improver F1 below | 0.3 parts by mass |
| Chloroform | 1,860 parts by mass |

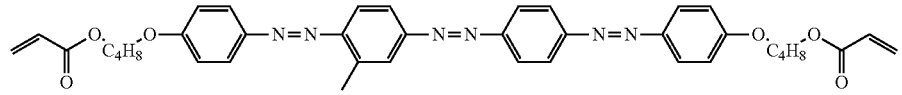

D1

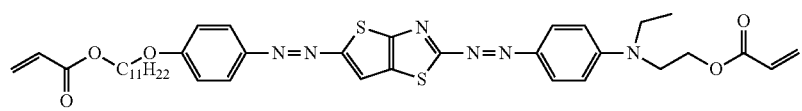

D2

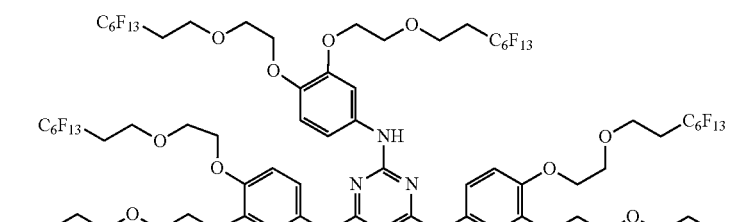

F1

Examples 2 to 7 and Comparative Examples 1 to 3

A light absorption anisotropic film was prepared on the alignment film 1 in the same manner as in Example 1, except that the kind of high-molecular weight liquid crystal com- Optics, Inc., product name "QE65000"), an absorbance of the light absorption anisotropic film in a wavelength region described in Table 1 was measured to calculate an alignment degree by the following expression. The results are shown in Table 1 below.

Alignment degree: $S=[(Az0/Ay0)-1]/[(Az0/Ay0)+2]$

Az0: Absorbance of light absorption anisotropic film with respect to polarization in absorption axis direction.

Ay0: Absorbance of light absorption anisotropic film with respect to polarization in polarization axis direction.

[Plane Shape Uniformity]

A light absorption anisotropic film arranged on the alignment film was sandwiched for observation between two polarizing plates arranged on the crossed nicols, and the light absorption anisotropic film was rotated in a horizontal plane, thereby checking the state of lightness and darkness. From the state of lightness and darkness, the unevenness, repelling, and alignment defects at the time of coating were checked.

A: Unevenness and cissing are not visually observed overall.

B: Unevenness and cissing are visually observed partially.

C: Unevenness and cissing are visually observed overall.

mesogenic group is used (Example 2), a light absorption anisotropic film having higher alignment degree can be formed.

On the other hand, it has been shown that in a case where a high-molecular weight liquid crystal compound having no repeating unit (2) described above is used, the plane shape uniformity of the light absorption anisotropic film is inferior (Comparative Examples 1 and 3).

In addition, in the liquid crystal composition containing the high-molecular weight liquid crystal compound having the above-described repeating unit (1) and the above-described repeating unit (2), in a case where the content of (2) was more than 10% by mass with respect to the content of all the repeating units contained in the high-molecular weight liquid crystal compound, the liquid crystal composition was gelated and thus each of the evaluations could not be carried out (Comparative Example 2).

TABLE 1

| | Monofunctional monomer | | Monofunctional monomer | | Polyfunctional monomer | | Kind of high-molecular weight liquid crystal compound | Evaluation result | |
|---|---|---|---|---|---|---|---|---|---|
| | Kind | Used amount (parts by mass) | Kind | Used amount (parts by mass) | Kind | Used amount (parts by mass) | | Alignment degree | Plane shape uniformity |
| Example 1 | 1a-1 | 79.76 | 1a-2 | 20 | 2a-1 | 0.3 | 1-1 | 0.96 | A |
| Example 2 | 1a-1 | 79.76 | 1a-2 | 20 | 2a-1 | 1 | 1-2 | 0.96 | A |
| Example 3 | 1a-1 | 79.76 | 1a-2 | 20 | 2a-1 | 2 | 1-3 | 0.95 | A |
| Example 4 | 1a-1 | 79.76 | 1a-2 | 20 | 2a-1 | 3 | 1-4 | 0.95 | A |
| Example 5 | 1a-1 | 80 | 1a-2 | 20 | 2a-2 | 1 | 1-5 | 0.95 | A |
| Example 6 | 1a-1 | 80 | 1a-2 | 20 | 2a-3 | 1 | 1-6 | 0.95 | A |
| Example 7 | 1a-1 | 100 | — | — | 2a-4 | 0.3 | 1-7 | 0.95 | A |
| Comparative Example 1 | 1a-1 | 80 | 1a-2 | 20 | — | — | 1-8 | 0.96 | C |
| Comparative Example 2 | 1a-1 | 79.76 | 1a-2 | 20 | 2a-1 | 15 | 1-9 | Could not evaluated (gelation) | |
| Comparative Example 3 | 1a-1 | 100 | 1a-2 | 0.3 | — | — | 1-10 | 0.95 | C |

As shown in Table 1, it has been shown that in the liquid crystal composition containing the dichroic substance and the high-molecular weight liquid crystal compound has the above-described repeating unit (1) and the above-described repeating unit (2), in a case where the content of the repeating unit (1) is 90% by mass or more and the content of the repeating unit (2) is 10% by mass or less with respect to the total content of all the repeating units contained in the high-molecular weight liquid crystal compound, a light absorption anisotropic film that is excellent in plane shape uniformity and has a high alignment degree can be formed (Examples 1 to 7).

Further, from the comparison between Example 2 and Example 5, it has been shown that regarding the repeating unit corresponding to Formula (2), in a case where a high-molecular weight liquid crystal compound in which the groups corresponding to P2 and P3 are the same group, the groups corresponding to L2 and L3 are the same group, the groups corresponding to SP2 and SP3 are the same group, and the groups corresponding to M2 and M3 are the same group) is used (Example 2), a light absorption anisotropic film t having a higher alignment degree can be formed. A similar tendency was shown from the comparison between Example 1 and Example 7.

Further, from the comparison between Example 2 and Example 6, it has been shown that in a case where a high-molecular weight liquid crystal compound in which the repeating unit corresponding to Formula (2) contains a

What is claimed is:

1. A liquid crystal composition comprising:
   a high-molecular weight liquid crystal compound; and
   a dichroic substance,
   wherein the high-molecular weight liquid crystal compound is a copolymer containing a repeating unit (1) represented by Formula (1) and a repeating unit (2) represented by Formula (2),
   a content of the repeating unit (1) is 90% by mass or more with respect to a total mass of all repeating units contained in the high-molecular weight liquid crystal compound, and
   a content of the repeating unit (2) is 10% by mass or less with respect to the total mass of all the repeating units contained in the high-molecular weight liquid crystal compound,

(1)

in Formula (1), P1 represents a main chain of the repeating unit, L1 represents a single bond or a divalent linking group, SP1 represents a spacer group, M1 represents a mesogenic group having three or more cyclic structures, and T1 represents a terminal group, and

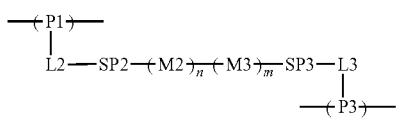

(2)

in Formula (2), P2 and P3 each independently represent a main chain of the repeating unit, L2 and L3 each independently represent a single bond or a divalent linking group, SP2 and SP3 each independently represent a single bond or a spacer group, M2 and M3 each independently represent a mesogenic group, and n and m each independently represent an integer of 0 or 1.

2. The liquid crystal composition according to claim 1, wherein a sum of n and m in Formula (2) is 1.

3. The liquid crystal composition according to claim 1, wherein a partial structure represented by $-(M2)_n-(M3)_m-$ in Formula (2) includes two or more cyclic structures.

4. The liquid crystal composition according to claim 1, wherein in Formula (2), P2 and P3 are the same group, both L2 and L3 are a single bond or the same group, both SP2 and SP3 are a single bond or the same group, and M2 and M3 are the same group.

5. The liquid crystal composition according to claim 1, wherein the content of the repeating unit (2) is 0.001% to 3% by mass with respect to the total mass of all repeating units contained in the high-molecular weight liquid crystal compound.

6. A method for producing a high-molecular weight liquid crystal compound, the method comprising a step of copolymerizing a monofunctional monomer and a polyfunctional monomer to obtain a high-molecular weight liquid crystal compound,
wherein a content of the monofunctional monomer is 90% by mass or more with respect to a content of all monomers that are used for polymerizing the high-molecular weight liquid crystal compound,
wherein a content of the polyfunctional monomer is 10% by mass or less with respect to the content of all the monomers that are used for polymerizing the high-molecular weight liquid crystal compound,
wherein the monofunctional monomer contains a mesogenic group.

7. The method for producing a high-molecular weight liquid crystal compound according to claim 6, wherein the monofunctional monomer is a compound represented by Formula (1a),

*P1a-L1-SP1-M1-T1a* (1a)

in Formula (1a), P1a represents a polymerizable group, L1 represents a single bond or a divalent linking group, SP1 represents a spacer group, M1 represents a mesogenic group having three or more cyclic structures, and T1a represents a terminal group.

8. The method for producing a high-molecular weight liquid crystal compound according to claim 6, wherein the polyfunctional monomer is a compound represented by Formula (2a),

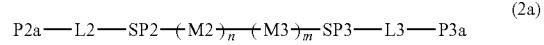

(2a)

in Formula (2a), P2a and P3a each independently represent a polymerizable group, L2 and L3 each independently represent a single bond or a divalent linking group, SP2 and SP3 each independently represent a single bond or a spacer group, M2 and M3 each independently represent a mesogenic group, and n and m each independently represent an integer of 0 or 1.

9. The method for producing a high-molecular weight liquid crystal compound according to claim 8, wherein a sum of n and m in Formula (2a) is 1 or 2.

10. The method for producing a high-molecular weight liquid crystal compound according to claim 9, wherein a partial structure represented by $-(M2)_n-(M3)_m-$ in Formula (2a) includes two or more cyclic structures.

11. The method for producing a high-molecular weight liquid crystal compound according to claim 8, wherein in Formula (2a), P2a and P3a are the same group, both L2 and L3 are a single bond or the same group, both SP2 and SP3 are a single bond or the same group, and M2 and M3 are the same group.

12. The method for producing a high-molecular weight liquid crystal compound according to claim 6, wherein the content of the polyfunctional monomer is 0.001% to 3% by mass with respect to the content of all the monomers that are used for polymerizing the high-molecular weight liquid crystal compound.

13. A light absorption anisotropic film which is formed from the liquid crystal composition according to claim 1.

14. A laminate comprising:
a base material; and
the light absorption anisotropic film according to claim 13, which is provided on the base material.

15. The laminate according to claim 14, further comprising a λ/4 plate which is provided on the light absorption anisotropic film.

16. An image display device comprising:
the light absorption anisotropic film according to claim 14.

17. An image display device comprising:
the laminate according to claim 15.

18. The liquid crystal composition according to claim 1, wherein a sum of n and m in Formula (2) is 2.

19. The liquid crystal composition according to claim 2, wherein a partial structure represented by $-(M2)_n-(M3)_m-$ in Formula (2) includes two or more cyclic structures.

* * * * *